(12) United States Patent
Iwata

(10) Patent No.: US 7,705,388 B2
(45) Date of Patent: Apr. 27, 2010

(54) NONVOLATILE SEMICONDUCTOR MEMORY DEVICE HAS SOURCE-LINE-SIDE DIODE FORMED IN A CONTACT FOR CONNECTING SOURCE LINE AND MEMORY CELL STRING IN DIRECTION PERPENDICULAR TO SUBSTRATE

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 11/828,795

(22) Filed: Jul. 26, 2007

(65) Prior Publication Data

US 2008/0048237 A1 Feb. 28, 2008

(30) Foreign Application Priority Data

Jul. 26, 2006 (JP) .............................. 2006-203325

(51) Int. Cl.
H01L 27/115 (2006.01)
(52) U.S. Cl. .................. 257/314; 257/315; 257/316; 257/E27.103; 257/E27.033
(58) Field of Classification Search ......... 257/314–316, 257/E27.033, E27.103, E29.226; 365/185.01, 365/185.17, 185.05, 175
See application file for complete search history.

(56) References Cited

U.S. PATENT DOCUMENTS

| 6,136,650 | A | 10/2000 | Lee |
| 6,795,334 | B2 | 9/2004 | Iwata et al. |
| 6,849,905 | B2 | 2/2005 | Ilkbahar et al. |
| 6,944,048 | B2 | 9/2005 | Iwata |
| 7,233,526 | B2 * | 6/2007 | Umezawa ............... 365/185.27 |
| 2003/0123271 | A1 | 7/2003 | Iwata |
| 2004/0124466 | A1 | 7/2004 | Walker et al. |
| 2004/0155302 | A1 | 8/2004 | Zhang |

FOREIGN PATENT DOCUMENTS

JP 5-326892 12/1993

OTHER PUBLICATIONS

Tetsuo Endoh, et al., "Novel Ultrahigh-Density Flash Memory With a Stacked-Surrounding Gate Transistor (S-SGT) Structured Cell", IEEE Transactions on Electronic Devices, vol. 50, No. 4, Apr. 2003, pp. 945-951.
Kang-Deog Suh, et al., "A 3.3V 32MB NAND Flash Memory With Incremental Step Pulse Programming Scheme", ISSCC 95, Digest of Technical Papers, Feb. 1995, pp. 128-129, 350.
Andrew J. Walker, et al., "3D TFT-SONOS Memory Cell for Ultra-High Density File Storage Applications", 2003 Symposium on VLSI Technology Digest of Technical Papers, Jun. 2003, pp. 29-30.
Mark Johnson, et al., "512-MB Prom With a Three Dimensional Array of Diode/Antifuse Memory Cells", IEEE Journal of Solid State Circuits, vol. 38, No. 11, Nov. 2003, pp. 1920-1928.

* cited by examiner

*Primary Examiner*—Anh Phung
*Assistant Examiner*—Allison P Bernstein
(74) *Attorney, Agent, or Firm*—Oblon, Spivak, McClelland, Maier & Neustadt, L.L.P.

(57) ABSTRACT

A nonvolatile semiconductor memory device includes: a source-line-side diode an anode region that is connected to a source line; a bit-line-side diode a cathode region that is connected to a bit line; and memory cell string connected between a cathode region of the source-line-side diode and an anode region of the bit-line-side diode. The memory cell string includes a series connection of a plurality of memory cell transistors. The source-line-side diode is formed in a contact for connecting the source line and the memory cell string in a first direction perpendicular to a semiconductor substrate. The bit-line-side diode is formed in a contact for connecting the bit line and the memory cell string in the first direction.

19 Claims, 29 Drawing Sheets

FIG. 6

|  | SUBSTRATE | SELECTED STRING | | | | UNSELECTED STRING | | |
| --- | --- | --- | --- | --- | --- | --- | --- | --- |
|  |  | BL | STL | SELECTED CG | UNSELECTED CG | BL | STL | CG |
| READ | VSS | FLOATING (Vss PRECHARGE) | VDD | VSS | VRR | VDD | VSS | VSS |
| '0' WRITE | VSS | VSS | VSS (VDD PRECHARGE) | VPP | VMM | VMM | VSS | VSS |
| '1' WRITE | | VMM | | VPP | - | | | |
| ERASE | VEE | FLOATING | FLOATING | VPP | - | FLOATING | FLOATING | VEE |

FIG. 8

|  | SELECTED STRING | | | UNSELECTED STRING | | |
| --- | --- | --- | --- | --- | --- | --- |
|  | BL | STL | SELECTED CG | UNSELECTED CG | BL | STL | CG |
| READ | FLOATING (Vss PRECHARGE) | VDD | VSS | VRR | VDD | VSS | VSS |
| '0' WRITE | VSS | VSS (VDD PRECHARGE) | VPP | VMM | VMM | VSS | VSS |
| '1' WRITE | VMM | | | | | | |
| ERASE | FLOATING | VEE | VSS/VXX | — | VSS | VSS | VSS |

FIG. 15

| | SELECTED STRING | | | | UNSELECTED STRING | | |
|---|---|---|---|---|---|---|---|
| | BL | STL | SELECTED CG | UNSELECTED CG | BL | STL | CG |
| READ | FLOATING (Vss PRECHARGE) | VDD | VSS | VRR | VDD | VSS | VSS |
| '0' WRITE | VSS | VSS (VDD PRECHARGE) | VPP | VMM | VMM | VSS | VSS |
| '1' WRITE | VMM | | | | | | |
| ERASE | FLOATING | VEE | VSS/VXX | - | VSS | VSS | VSS |

FIG. 25

| | SELECTED STRING | | | | | UNSELECTED STRING | | | |
|---|---|---|---|---|---|---|---|---|---|
| | BGL | BL | STL | SELECTED CG | UNSELECTED CG | BGL | BL | STL | CG |
| READ | VSS | FLOATING (Vss PRECHARGE) | VDD | VSS | VRR | VSS | VDD | VSS | VSS |
| '0' WRITE | VSS | VSS | VSS (VDD PRECHARGE) | VPP | VMM | VSS | VMM | VSS | VSS |
| '1' WRITE | | VMM | | | | | | | |
| ERASE | VEE | FLOATING | FLOATING | VSS | — | VSS | FLOATING | FLOATING | VEE |

NONVOLATILE SEMICONDUCTOR MEMORY DEVICE HAS SOURCE-LINE-SIDE DIODE FORMED IN A CONTACT FOR CONNECTING SOURCE LINE AND MEMORY CELL STRING IN DIRECTION PERPENDICULAR TO SUBSTRATE

CROSS-REFERENCE TO RELATED APPLICATIONS

This application is based upon and claims the benefit of priority from Japanese Patent Application No. 2006-203325, filed on Jul. 26, 2006, the entire contents of which are incorporated herein by reference.

BACKGROUND

1. Technical Field

The present invention relates to a nonvolatile semiconductor memory device, such as a NAND nonvolatile semiconductor memory device, capable of being manufactured by a simplified process and having an increased storage capacity.

2. Description of Related Art

NAND nonvolatile semiconductor memory devices includes a series connected plural transistors as memory cells each including a charge storage layer in a gate insulating film and select gate transistors (generally, MOS transistors) respectively connected to the two ends of the series connection. As an example of the transistor used for the memory sell, there is used the following transistors: a memory cell transistor having a layered gate structure including a floating gate electrode layer; or a memory cell transistor having MONOS structure or SONOS structure, which includes an insulating film (ONO structure) as a gate insulating film having a silicon oxide film/silicon nitride film/silicon oxide film layered structure.

When the select gate transistor has the same layered structure as the memory cell transistor, electrons or holes may be stored in the charge storage layer of the select gate transistor due to, for example, voltage stress at the time of read state although it is not intended to perform write or erase operations on the select gate transistor as a target. In this case, when the select gate transistor is n-channel MOS transistor, the select gate transistor is not turned on because of increase of the threshold voltage or is not turned off because of decrease of the threshold voltage, which results in that the selectivity is impaired. For this reason, the select gate transistor needs to be formed by a different manufacturing process than the memory cell transistors.

In case where the memory cell transistor has the ONO structure, after a silicon oxide film, a silicon nitride film, and a silicon oxide film are formed on a silicon semiconductor substrate, or after a silicon oxide film and a silicon nitride film are formed on a silicon semiconductor substrate, the formed insulating films are removed in a region for forming a select gate transistor, a silicon oxide film is then formed at the region by oxidation, and a select gate transistor is finally formed as a usual MOS transistor.

In case where the memory cell transistor has the floating gate structure, it is desirable that the select gate transistor and the memory cell transistor have the same structure in a gate processing including lithography. Therefore, although the gate electrode of the lower layer is not separated for each select gate transistor, the select gate transistor also becomes a two-layer structure. However, it becomes a floating gate structure as it is and thus it is necessary to provide a contact portion of a two-layer gate including a floating gate electrode layer and a control gate electrode layer at a cell array end or in a cell array.

As described above, the presence of the select gate transistor complicates the manufacturing process. Furthermore, spaces for forming separated gate insulating films or regions for short-circuiting the two-layer gate electrodes are needed between the select gate transistors and the memory cell transistors, which result in increase in the memory cell size or the memory cell array area.

JP-A-5-326892 (see FIG. 4 of this document) discloses a NAND nonvolatile semiconductor memory device in which a diode, instead of the source-side select gate transistor, is connected in series to the memory cell transistors. Write operation is prohibited by charging-up of the channel region by utilizing the characteristics of the diode to turn off when a reverse voltage is applied. At the time of read operation, the diode is turned on by applying voltage to the source line side and voltage is applied to the gate electrodes of the memory cell transistors which are connected to the diode in series. A "1" or "0" state of the memory cell transistor of a target memory cell can be read out depending on whether it is on or off.

US 2004/0124466 A1 and A. J. Walker et al. ("3D TFT-SONOS Memory Cell for Ultra-High Density File Storage Applications," 2003 Symposium on VLSI Technology Digest of Technical Papers, June 2003) discloses an example in which memory cell transistors, which are thin-film transistors (TFTs) having an ONO structure charge storage dielectric layer are connected to each other in series to form a NAND string, are applied to a 3D flash memory. Likewise, US 2004/0155302 A1 discloses a 3D mask programmable ROM and its peripheral circuit configuration.

Although the storage capacity of memories has been increased by the miniaturization, investments are increasing as the degree of miniaturization increases. As a result, a tendency to produce an inexpensive, high-capacity layered memory using facilities which are low in running cost though the process is long is now increasing (see the document by A. J. Walker et al referred above).

M. Johnson et al. ("512-Mb PROM with a Three-Dimensional Array of Diode/Antifuse Memory Cells," IEEE J. Solid-State Circuits, Vol. 38, No. 11, pp. 1,920-1,928, November 2003) discloses a 3D PROM including diode/antifuse memory cells having a stacked structure in which eight layers are stacked in the vertical direction. Furthermore, K-D. Sung et al. ("A 3.3-V, 32 Mb NAND Flash Memory with Incremental Step Pulse Programming Scheme," 1995 IEEE International Solid-State Circuits Conference, pp. 128-129, Feb. 15-17, 1995) discloses an incremental step pulse programming (ISPP) NAND flash memory capable of reducing the page program current by self-boosting the program suppression voltage and capable of attaining high-speed read throughput by interleaved data paths.

SUMMARY

According to a first aspect of the invention, there is provided a nonvolatile semiconductor memory device including: a source-line-side diode an anode region that is connected to a source line; a bit-line-side diode a cathode region that is connected to a bit line; and memory cell string connected between a cathode region of the source-line-side diode and an anode region of the bit-line-side diode, the memory cell string including a series connection of a plurality of memory cell transistors containing a first stage transistor connected to the source-line-side diode and a last stage transistor connected to the bit-line-side diode, wherein the source-line-side diode is formed in a contact for connecting the source line and the memory cell string in a first direction perpendicular to a semiconductor substrate, and the bit-line-side diode is formed in a contact for connecting the bit line and the memory cell string in the first direction.

According to a second aspect of the invention, there is provided a nonvolatile semiconductor memory device including: a first source-line-side diode having an anode region connected to a source line; a first bit-line-side diode having a cathode region connected to a first bit line; a first memory cell string connected between a cathode region of the first source-line-side diode and an anode region of the first bit-line-side diode, the first memory cell string including a series connection of a plurality of memory cell transistors; a second source-line-side diode having an anode region connected to the source line; a second bit-line-side diode having a cathode region connected to a second bit line; and a second memory cell string connected between a cathode region of the second source-line-side diode and an anode region of the second bit-line-side diode, the second memory cell string including a series connection of a plurality of memory cell transistors, wherein the first memory cell string and the second memory cell string are layered above a semiconductor substrate via an interlayer insulating film, wherein each of the first and second source-line-side diodes is formed in a contact for connecting the source line and the first or second memory cell string in a first direction perpendicular to the semiconductor substrate, wherein the first bit-line-side diode is formed in a contact for connecting the first bit line and the first memory cell string in the first direction, and wherein the second bit-line-side diode is formed in a contact for connecting the second bit line and the second memory cell string in the first direction.

According to a third aspect of the invention, there is provided a nonvolatile semiconductor memory device including; a first source-line-side diode having an anode region connected to a first source line; a bit-line-side diode having a cathode region connected to a bit line; a first memory cell string connected between a cathode region of the first source-line-side diode and an anode region of the bit-line-side diode, the first memory cell string including a series connection of a plurality of memory cell transistors; a second source-line-side diode having an anode region connected to a second source line; and a second memory cell string connected between a cathode region of the second source-line-side diode and the anode region of the bit-line-side diode, the second memory cell string including a series connection of a plurality of memory cell transistors, wherein the first memory cell string and the second memory cell string are formed in a same layer above a semiconductor substrate via an interlayer insulating film, wherein the first source-line-side diode is formed in a contact for connecting the first source line and the first memory cell string in a first direction perpendicular to the semiconductor substrate, wherein the second source-line-side diode is formed in a contact for connecting the second source line and the second memory cell string in the first direction, and wherein the bit-line-side diode is formed in a contact for connecting the bit line and the first and second memory cell strings in the first direction.

BRIEF DESCRIPTION OF THE DRAWINGS

FIG. 6 shows an example of operation voltage of the nonvolatile semiconductor memory device according to the first embodiment of the invention.

FIG. 8 shows an example of operation voltage of the nonvolatile semiconductor memory device according to the second embodiment of the invention.

FIG. 15 shows an example of operation voltage of the nonvolatile semiconductor memory device according to the third embodiment of the invention;

FIGS. 22A to 22D are schematic planar pattern diagrams for description of wiring at end portions of a memory cell array of layered NAND cell units (four layers) of the nonvolatile semiconductor memory device according to the fourth embodiment of the invention in which diodes are employed as the select gates and the memory cell transistor has the SONOS/TFT structure, in which FIG. 22A is a schematic diagram showing contacts which connect the first layer of the memory cell array to a CMOS layer, FIG. 22B is a schematic diagram showing contacts which connect the second layer of the memory cell array to its first layer, FIG. 22C is a schematic diagram showing contacts which connect the third layer of the memory cell array to its second layer, and FIG. 22D is a schematic diagram showing contacts which connect the fourth layer of the memory cell array to its third layer;

FIG. 25 shows an example of operation voltage of the nonvolatile semiconductor memory device according to the fifth embodiment of the invention;

DETAILED DESCRIPTION

Figure 1:
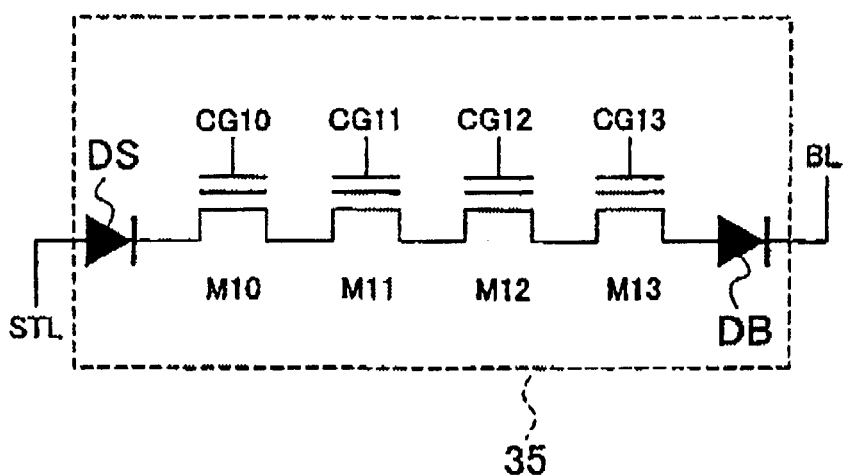
FIG. 1 shows a schematic circuit configuration of a NAND cell unit of a nonvolatile semiconductor memory device according to a first embodiment of the present invention in which diodes are employed as select gates and the memory cell transistor has a stack gate structure.

First to sixth embodiments of the present invention will be described with reference to the drawings. In the drawings, the same or similar elements are denoted by the same or similar symbols. However, it should be noted that the drawings are schematic and a relationship between a thickness and planar dimensions, a ratio between thicknesses of respective layers, etc. are different from a actual relationship, ratio, etc. Specific thicknesses and dimensions should be judged taking the following description into consideration. It goes without saying that a relationship or a ratio between dimensions may be different in two or more drawings.

The first to sixth embodiments described below are just examples of devices or methods for implementing the technical concept of the invention, and in the technical concept of the invention the materials, shapes, structures, arrangements, etc. of components are not limited to the ones described below. As for the technical concept of the invention, various modifications to the embodiments are possible without departing from the scope of the claims.

First Embodiment (Stack Gate Structure)

An exemplary memory cell transistor employed in a nonvolatile semiconductor memory device according to the first embodiment of the invention has a stack gate structure which includes source/drain regions, a channel region between the source/drain regions, a gate insulating film formed on the channel region, a floating gate electrode formed on the gate insulating film, an intergate insulating film formed on the floating gate electrode, and a control gate electrode formed on the intergate insulating film.

FIG. 1 shows a schematic circuit configuration of a NAND cell unit 35 of the nonvolatile semiconductor memory device according to the first embodiment of the invention in which the memory cell transistor has the stack gate structure. The NAND cell unit 35 includes a source-line-side diode DS having an anode region connected to a source line STL, a bit-line-side diode DB having a cathode region connected to a bit line BL, and a memory cell string connected between the cathode region of the source-line-side diode DS and the anode region of the bit-line-side diode DES. The memory cell string includes plural memory cell transistors M10, M11, M12, and M13 each having the stack gate structure and connected in series via their source/drain regions.

(SONOS Structure)

Another exemplary memory cell transistor employed in a nonvolatile semiconductor memory device according to the first embodiment of the invention has a SONOS structure which includes source/drain regions, a channel region between the source/drain regions, an ONO insulating film formed on the channel region, and a control gate electrode formed on the ONO insulating film.

Figure 2:
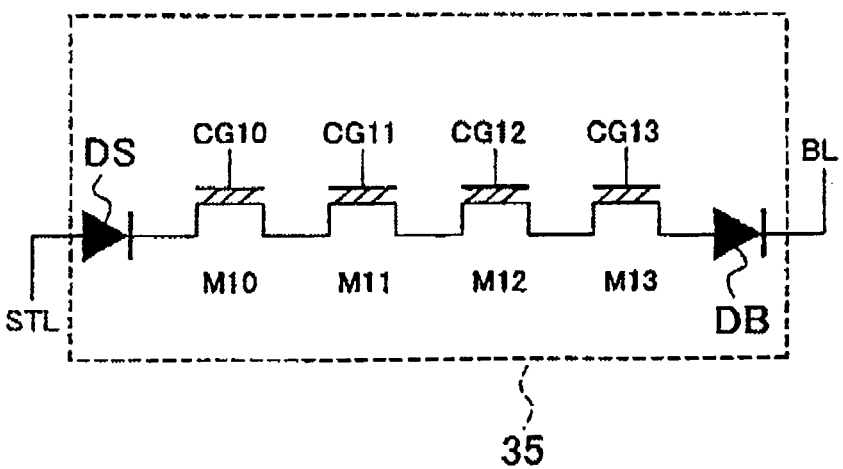
FIG. 2 shows a schematic circuit configuration of a NAND cell unit of a nonvolatile semiconductor memory device according to the first embodiment of the invention in which diodes are employed as select gates and the memory cell transistor has a SONOS structure.

FIG. 2 shows a schematic circuit configuration of a NAND cell unit 35 of the nonvolatile semiconductor memory device according to the first embodiment of the invention in which the memory cell transistor has the SONOS structure. The NAND cell unit 35 includes a source-line-side diode DS having an anode region connected to a source line STL, a bit-line-side diode DB having a cathode region connected to a bit line BL, and a memory cell string are connected between the cathode region of the source-line-side diode DS and the anode region of the bit-line-side diode DB. The memory cell string includes plural memory cell transistors M10, M11, M12, and M13 each having the SONOS structure and connected in series via their source/drain regions.

(Entire Block Configuration)

Figure 3:
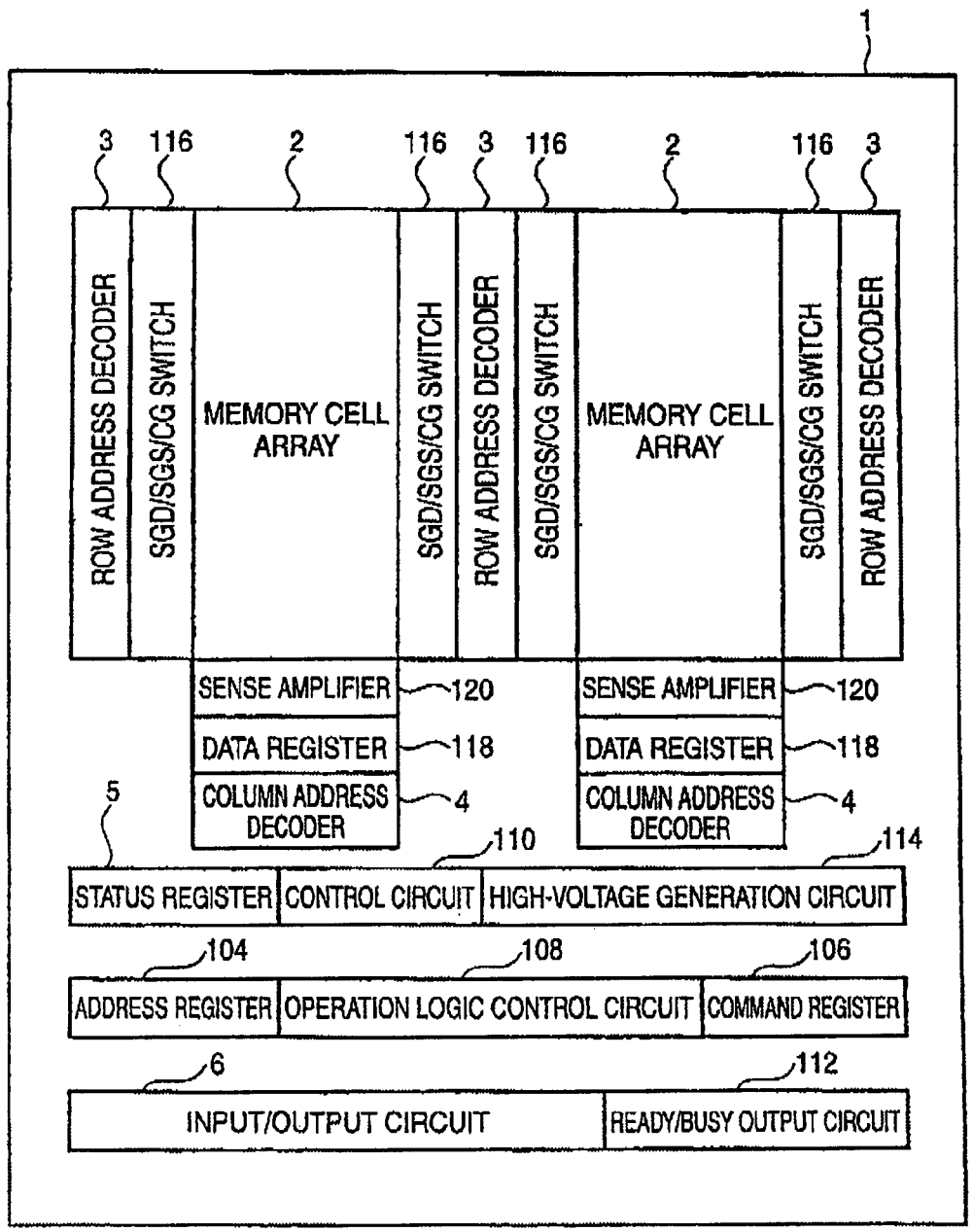
FIG. 3 shows a schematic entire block configuration of the nonvolatile semiconductor memory device according to the first embodiment of the invention.

FIG. 3 shows a schematic entire block configuration of the nonvolatile semiconductor memory device according to the first embodiment of the invention. A semiconductor chip 1 includes a memory cell array 2, a row address decoder 3 disposed around the memory cell 2, a column address decoder 4 disposed around the memory cell 2, a status register 5, an input/output circuit 6, an SGD/SGS/CG switch 116, a sense amplifier 120, a data register 118, a control circuit 110, a high-voltage generation circuit 114, a ready/busy output circuit 112, an address register 104, a command register 106, and an operation logic control circuit 108.

Figure 4:
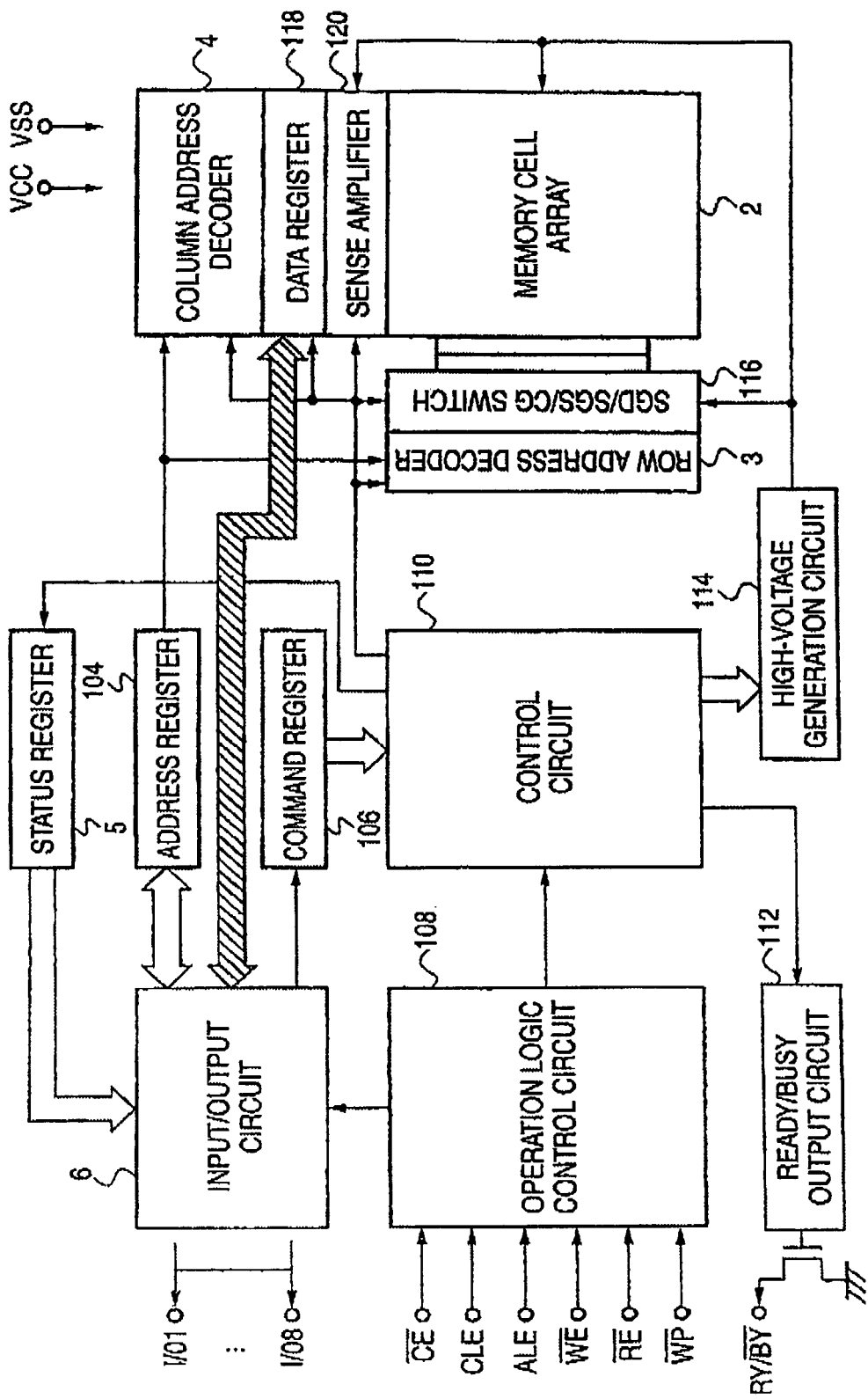
FIG. 4 shows a detailed entire block configuration of the nonvolatile semiconductor memory device according to the first embodiment of the invention.

FIG. 4 shows a detailed entire block configuration of the nonvolatile semiconductor memory device according to the first embodiment of the invention. The sense amplifier 120, the data register 118, and the column address decoder 4 are disposed close to the memory cell array 2 in the column direction. The SGD/SGS/CG switch 116 and the row address decoder 3 are disposed close to the memory cell array 2 in the row direction. The high-voltage generation circuit 114 supplies high-voltage signal pulses to the SGD/SGS/CG switch 116, the memory cell array 2, and the sense amplifier 120. The control circuit 110 supplies control signals to the high-voltage generation circuit 114 and the peripheral circuits of the memory cell array 2. The command register 106 supplies command signals to the control circuit 110. The address register 104 supplies address signals to the column address decoder 4 and the row address decoder 3. The status register 5 and the ready/busy output circuit 112 receive control signals from the control circuit 110. The operation logic control circuit 108 supplies control signals to the control circuit 110. The input/output circuit 6 receives control signals from the operation logic control circuit 108, receives status information from the status register 5, supplies command signals to the command register 106, and exchanges data with the address register 104 and the data register 118.

As shown in FIG. 4, input/output ports I/O1 to I/O8 for address, data and command are connected to the input/output circuit 6. As shown in FIG. 4, a chip enable signal /CE, a command latch enable signal CLE, an address latch enable signal ALE, a write enable signal /WE, a read enable signal /RE, and a write protect signal /WP are supplied to the operation logic control circuit 108. Furthermore, as shown in FIG. 4, the ready/busy output circuit 112 outputs a ready/busy output signal RY//BY via a MOS transistor. Reference symbols VCC and VSS denote an external power supply potential and a ground potential, respectively. The external power supply potential VCC is used as an internal potential VDD as it is or converted into a power supply voltage VDD inside.

(Device Structure)

To save spaces for forming the diode and thereby increase the integration density, it is desirable that each of the source-line-side diode DS and the bit-line-side diode DB be formed in the direction perpendicular to the surface of the semiconductor substrate 10. The semiconductor substrate 10 may be either a bulk semiconductor or a well diffusion region in a semiconductor substrate.

Although the following description of the nonvolatile semiconductor memory device according to the first embodiment of the invention will be directed to an example in which the memory cell transistor is a TFT having the stack gate structure, memory cell transistors can be layered in a similar manner also in the case where they are TFTs having the SONOS structure.

In the nonvolatile semiconductor memory device according to the first embodiment of the invention, the memory cell unit is simplified by employing diodes instead of select gate transistors.

Figure 5A:
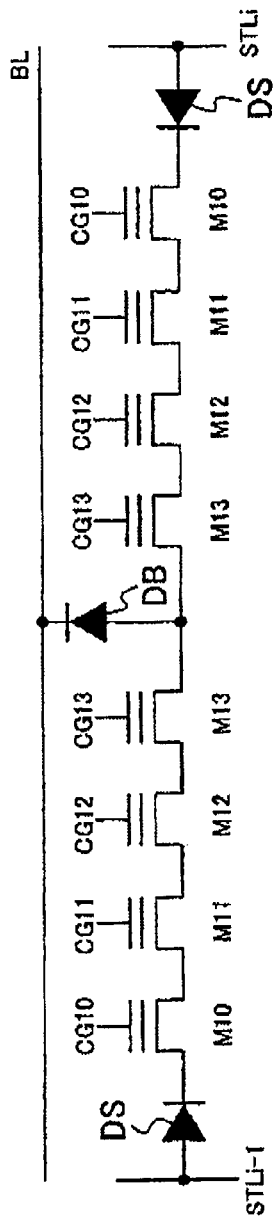
FIGS. 5A and 5B show a schematic circuit configuration and a schematic sectional structure, taken along the bit line extending direction (line I-I), of NAND cell units of the nonvolatile semiconductor memory device according to the first embodiment of the invention in which diodes are employed as the select gates and the memory cell transistor has the stack gate structure.
Figure 5B:
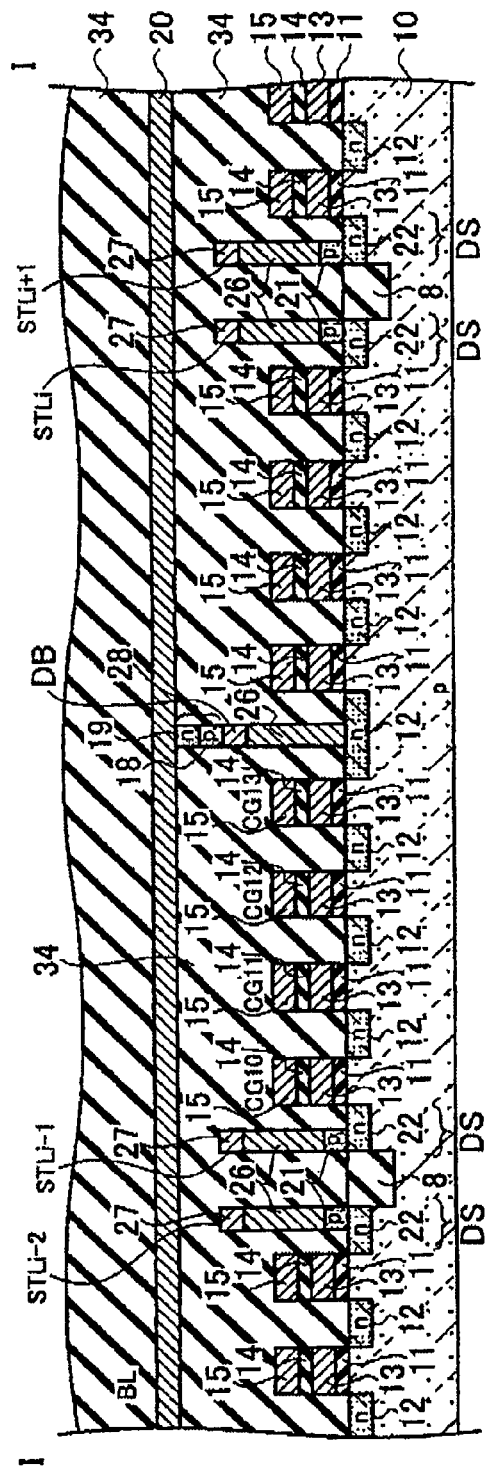

FIGS. 5A and 5B respectively show a circuit configuration and a schematic sectional structure of 4-NAND-cell units in which diodes are employed as the selective elements instead of MOS transistors and the memory cell transistor has the stack gate structure. It is assumed that the memory cell transistor is an nMOS transistor. It is 1o apparent that the memory cell transistor may also be a pMOS transistor (the conductive type is reversed). In this case, the potential relationships and the anode/cathode positions of each diode are reversed.

FIGS. 5A and 5B show, as an example, a first layer (the nearest layer to the semiconductor substrate 10) of the layers of memory cell transistors in the nonvolatile semiconductor memory device according to the first embodiment of the invention. Although not shown in any drawings, the positional relationship between the source/drain regions 12 and the control gate electrode 15 may be changed.

FIG. 5A shows the schematic circuit configuration of the NAND cell units of the nonvolatile semiconductor memory device according to the first embodiment of the invention in which diodes are employed as the select gates and the memory cell transistor has the stack gate structure. The NAND cell units includes a source-line-side diode DS having an anode region connected to a source line STLi−1, a bit-line-side diode DB having a cathode region connected to a bit line BL, a memory cell string which is connected between the cathode region of the source-line-side diode DS and the anode region of the bit-line-side diode DB and in which plural memory cell transistors M10, M11, M12, and M13 having the stack gate structure are connected in series via their source/drain regions 12, a source-line-side diode DS whose anode region is connected to a source line STLi, and a memory cell string which are connected between the cathode region of the source-line-side diode DS and the anode region of the bit-line-side diode DB and in which plural memory cell transistors M10, M11, M12, and M13 having the stack gate structure are connected in series via their source/drain regions 12.

As shown in FIG. 5B, the memory cell transistor used in the nonvolatile semiconductor memory device according to the first embodiment of the invention has a stack gate structure including a semiconductor substrate 10, source/drain regions 12 formed in the semiconductor substrate 10, a channel region between the source/drain regions 12, a gate insulating film 11 formed on the channel region, a floating gate electrode 13 formed on the gate insulating film 11, an intergate insulating film 14 formed on the floating gate electrode 13, and a control gate electrode 15 formed on the intergate insulating film 14.

FIG. 5B shows the schematic sectional structure, taken along the bit line extending direction (line I-I), of the NAND cell units of the nonvolatile semiconductor memory device according to the first embodiment of the invention in which diodes are employed as the select gates and the memory cell transistor has the stack gate structure. The NAND cell units are provided with a semiconductor substrate 10, field isolation regions (STI) 8 formed in the semiconductor substrate 10, a DS cathode region 22 of a source-line-side diode DS formed in the semiconductor substrate 10, a DS anode region 21 formed on the DS cathode region 22, a first contact plug 26 formed on the DS anode region 21, a metal electrode layer 27 formed on the first contact plug 26 and connected to a source line STLi−1 which extends in the row direction, a drain region 12 formed in the semiconductor substrate 10, a second contact plug 26 formed on the drain region 12, a metal electrode layer 28 formed on the second contact plug 26, a DB anode region 18 formed on the metal electrode layer 28, a DB cathode region 19 formed on the DB anode region 18, a bit line 20 connected to the DB cathode region 19 and extending in the column direction, and a memory cell string connected between the DS cathode region 22 of the source-line-side diode DS and the drain region 12 that is connected to the DB anode region 18 of the bit-line-side diode DB. The memory cell string includes plural memory cell transistors M10, M11, M12, and M13 having the stack gate structures which are connected in series via their source/drain regions 129 The above regions etc. are disposed between the field isolation regions 8.

In the nonvolatile semiconductor memory device according to the first embodiment of the invention, as shown in FIGS. 5A and 5B, the bit-line-side diode DB is used in common for the adjacent two memory cell strings in the column direction. That is, as shown in FIGS. 5A and 5B, the two memory cell strings each including the memory cell transistors M10, M11, M12, and M13 which are arranged in the column direction (i.e., bit line BL extending direction) are arranged symmetrically with respect to the bit-line-side diode DB. As such, the two memory cell strings are connected to the bit line BL via the common bit-line-side diode DB and disposed between the source lines STLi−1 and STLi.

NAND cell units each including the source line STL, the source-line-side diode DS, the memory cell transistors (M11, M11, M12, and M13), the bit-line-side diode DB, and the bit line BL as shown in FIGS. 5A and 5B may be layered via interlayer insulating films 34 in the direction perpendicular to the surface of the semiconductor substrate 10.

That is, plural memory cell transistors M20, M21, M22, and M23 are disposed above the plural memory cell transistors M10, M11, M12, and M13 via an interlayer insulating film 34, plural memory cell transistors M30, M31, M32, and M33 are disposed above the memory cell transistors M20, M21, M22, and M23 via an interlayer insulating film 34, and plural memory cell transistors M40, M41, M42, and M43 are disposed above the memory cell transistors M30, M31, M32, and M33 via an interlayer insulating film 34.

In the nonvolatile semiconductor memory device according to the first embodiment of the invention, word lines CG10, CG11, CG12, CG13, CG20, CG21, CG22, CG23, . . . , CG40, CG41, CG42, and CG43 which are connected to the control gate electrodes 15 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the contact plug 26 in the vertical direction.

On the bit line BL side, after an ohmic contact to the drain region 12 of the memory cell transistor M13 which is closest to the bit line BL is formed by the contact plug 26, the metal electrode layer 28 is formed on the contact plug 26 and the DS anode region 18 of a p-type silicon layer and the DE cathode region 19 of an n-type silicon layer are buried sequentially on the metal electrode layer 28. The bit-line-side diode DB is thus formed.

As described above, the occupation area of the NAND cell unit can be reduced by forming the source-line-side diode DS and the bit-line-side diode DE in the source-line-side contact and the bit-line-side contact, respectively.

The source-line-side diode DS located on the side of the source line STL may have a Schottky junction instead of a pn junction. Likewise, the bit-line-side diode DE located on the side of the bit line EL need not always be a pn-junction diode. Since the current direction at read may be one direction, the select element can be a diode instead of a MOS transistor. Since the diode is a two-terminal element, selection is made according to the voltage magnitude relationship between the source line STL and the bit line BL.

(Example of Operation Voltage)

FIG. 6 shows an example of operation voltage of NAND cell units of the nonvolatile semiconductor memory device according to the first embodiment of the invention which use the memory cell transistors having the stack gate structure.

For a selected memory cell string, FIG. 6 shows pulse voltage states of the substrate, the bit line BL, the source line STL, a selected word line CG, and an unselected word line CG in respective operation modes of a read mode, a "0"-write mode, a "1"-write mode, and an erase mode. Likewise, for an unselected memory cell string, FIG. 6 shows pulse voltage states of the bit line BL, the source line STL, and the word lines CG in respective operation modes of a read mode, a "0"-write mode, a "1"-write mode, and an erase mode. In FIG. 6, symbol VDD represents a power supply potential, VSS represents a ground potential, VRR represents a read voltage, VPP represents a write voltage, VEE represents an erase voltage, and VMM represents a bootstrap voltage. The read voltage VRR is set higher than Vth('0') (a threshold voltage in a "0"-written state).

A read operation is performed as charging from the source line STL to the bit line BL. The potential of the bit line BL remains the ground potential VSS or changes to a high level "H" in accordance with the threshold value of a selected memory cell transistor. Such a voltage is judged by the sense amplifier S/A.

A write verify operation and an erase verify operation are basically the same as the read operation except for differences in potential relationships (for example, the potential of a selected word line CG is higher than 0 V in the case of the write verify operation, and the potential of all the word lines CG in a selected memory cell string is 0 V in the case of the erase verify operation)

Write operation is performed in the following manner. To attain "1" write (an erased state is maintained) by self-boosting, the regions under the channels of a NAND cell unit is charged from the source line STL. Then, in the case of "0" write, the voltage of the bit line BL is set at 0 V for discharge and the channel potential is set at VBI (a built-in voltage of the BL-side diode, about 0.6V in the case of a silicon pn diode). In the case of "1" write, the bit line BL is given the power supply voltage VMM (high potential) for a pre-charged state is held, a selected word line CG is given the write voltage VPP, and the voltage of an unselected word line CG in a selected NAND string is increased to the bootstrap voltage VMM, whereby the channel potential is thus bootstrapped to a potential at which write is not caused.

The bootstrap voltage VMM is set at such a potential that "0" is not written to an unselected memory cell transistor in a selected NAND string when the channel potential is low, and that the channel potential of a "1"-written memory cell transistor is increased sufficiently and an erased state is thereby held. The precharge voltage for the source line STL may be set at the power supply voltage VDD. However, where the power supply voltage VDD is about 1.8 V, it is desirable that the precharge voltage for the source line STL be set at the bootstrap voltage VMM.

No problem arises as long as the voltage of the bit line BL at the time of "1" write is such as to prevent a fall of a bootstrap potential. However, setting the voltage of the bit line BL at the time of "1" write comparable to the precharge voltage for the source line STL is advantageous in a sense that it dispenses with formation of an extra power circuit, For example, the power supply voltage VDD may be applied to the bit line BL at "1" write, instead of the bootstrap voltage VMM.

In an erase operation, the erase voltage VEE is applied to the semiconductor substrate 10, a selected word line CG is given the ground potential VSS, and the source line STL is rendered in a floating state. The erase operation will be described below in detail.

First, an erase operation is performed by applying a high potential to the source region of the memory cell transistor M10 which is closest to the source line STL, from the source line STL via the source-line-side diode DS. Then, the potential of the word line CG of the memory cell transistor M10 which is closest to the source line STL is increased to VXX, whereby the high potential is transferred to the drain region of the memory cell transistor M10. That is, the high potential is applied to the source region of the next memory cell transistor M11 to effect erasure. Then, the potential of the word line CG of the memory cell transistor M11 is increased to VXX, whereby the high potential is transferred to the drain region of the memory cell transistor M11. That is, the high potential is applied to the source region of the next memory cell transistor M12 to effect erasure. The above operation is performed repeatedly, whereby the data of the memory cell transistors M10, M11, M12, and M13 of the selected memory cell string are erased.

The voltage VXX is a voltage that allows transfer of a high potential (VEE-VBI) where VBI is the built-in voltage of the source-line-side diode DS. The voltage VEE is a voltage that allows a low potential to cause development of a sufficiently strong electric field in the semiconductor substrate 10 through capacitive coupling between the control gate electrode and the floating gate electrode.

The NAND nonvolatile semiconductor memory device according to the first embodiment of the invention makes it possible to miniaturize and simplify each memory cell unit by disposing diodes instead of select gate transistors and to increase the storage capacity by layering the memory cell transistors.

Second Embodiment (Device Structure)

In a nonvolatile semiconductor memory device according to a second embodiment of the invention, memory cell transistors M10, M11, . . . , M13 are formed on a buried insulating film (BOX) 32. To save the diode formation spaces and thereby increase the integration density, it is desirable that each of the source-line-side diode DS and the bit-line-side diode DB be formed in the direction perpendicular to a surface of a semiconductor layer (an SOI structure in the case where the semiconductor is silicon) above the buried insulating film (BOX) 32.

Memory cell transistors which are superior in the cutoff characteristic can be realized by forming those using a thin semiconductor layer.

Although the following description of the nonvolatile semiconductor memory device according to the second embodiment of the invention will be directed to an example in which the memory cell transistor is a TFT having the stack gate structure, memory cell transistors can be layered in a similar manner also in the case where they are TFTs having the SONOS structure.

In the nonvolatile semiconductor memory device according to the second embodiment of the invention, the memory cell unit is simplified by employing diodes instead of select gate transistors.

Figure 7A:
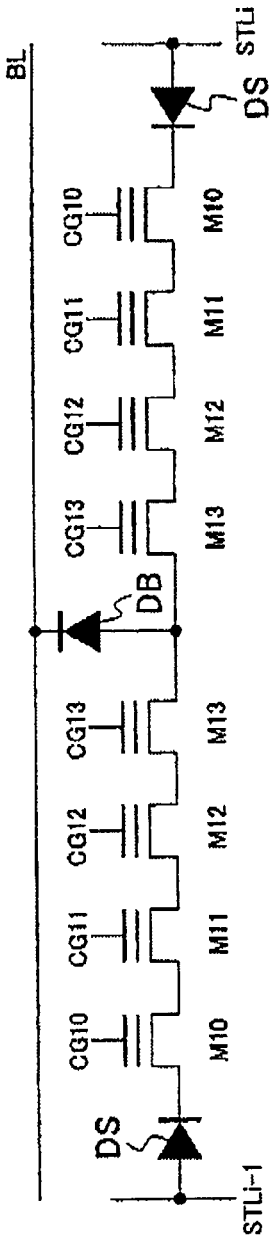
FIGS. 7A and 7B show a schematic circuit configuration and a schematic sectional structure, taken along the bit line extending direction (line I-I), of NAND cell units of a nonvolatile semiconductor memory device according to a second embodiment of the invention in which diodes are employed as the select gates and the memory cell transistor has the stack gate structure.
Figure 7B:
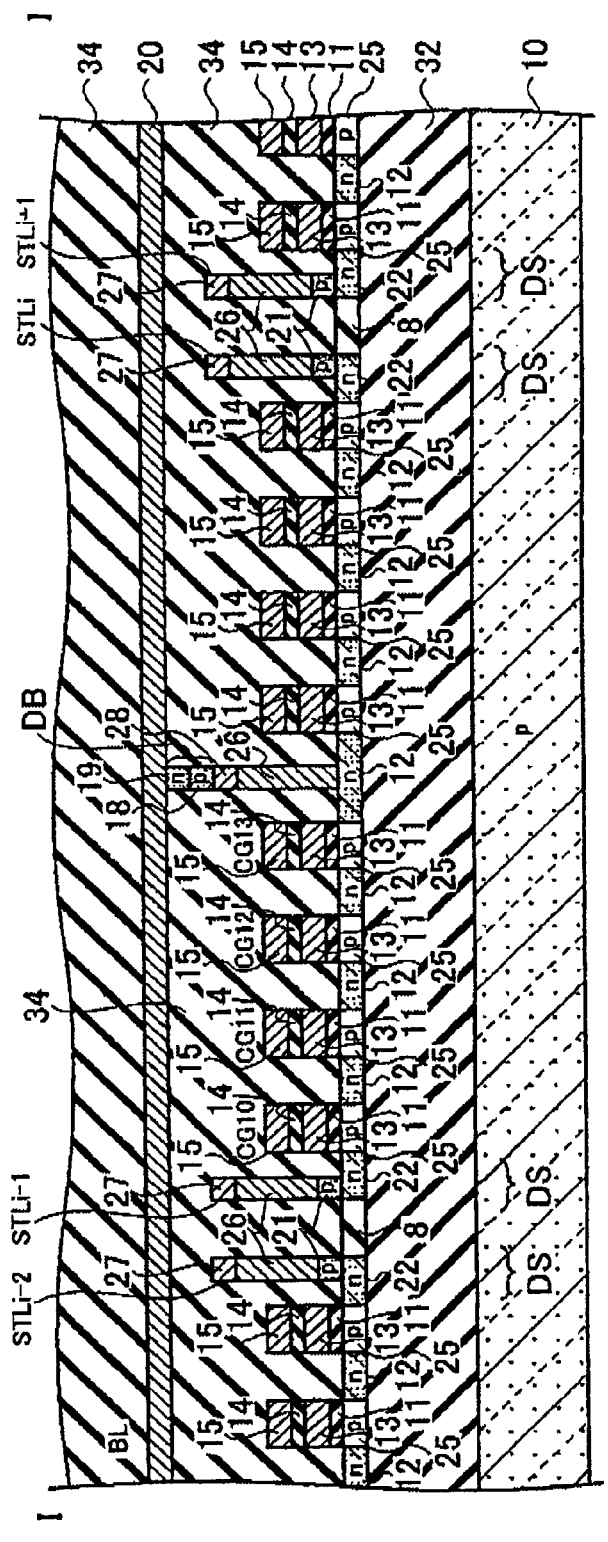

FIG. 7A and 7B show a circuit configuration and a schematic sectional structure of 4-NAND-cell units in which diodes are employed as the select elements instead of MOS transistors and the memory cell transistor has the stack gate structure. It is assumed that the memory cell transistor is an nMOS transistor. It is apparent that the memory cell transistor may also be a pMOS transistor (the conductive type is reversed). In this case, the potential relationships and the anode/cathode positions of each diode are reversed.

FIGS. 7A and 7B show, as an example, a first layer (the nearest layer to the semiconductor substrate 10) of the layers of memory cell transistors in the nonvolatile semiconductor memory device according to the second embodiment of the invention. Although not shown in any drawings, the positional relationship between the source/drain regions 12 and the control gate electrode 15 may be changed.

FIG. 7A shows the schematic circuit configuration of the NAND cell units of the nonvolatile semiconductor memory device according to the second embodiment of the invention in which diodes are employed as the select gates and the memory cell transistor has the stack gate structure. The NAND cell units includes a source-line-side diode DS having an anode region connected to a source line STLi−1, a bit-line-side diode DB having a cathode region connected to a bit line BL, a memory cell string connected between the cathode region of the source-line-side diode DS and the anode region of the bit-line-side diode DS and in which plural memory cell transistors M10, M11, M12, and M13 having the stack gate structure are connected to each other in series via their source/drain regions 12, a source-line-side diode DS whose anode region is connected to a source line STLi, and a memory cell string which are connected between the cathode region of the source-line-side diode DS and the anode region of the bit-line-side diode DB and in which plural memory cell transistors M10, M11, M12, and M13 having the stack gate structure are connected to each other in series via their source/drain regions 12.

As shown in FIG. 7B, the memory cell transistor used in the nonvolatile semiconductor memory device according to the second embodiment of the invention has a stack gate structure including a semiconductor substrate 10, a buried insulating film 32 formed on the semiconductor substrate 10, source/drain regions 12 formed on the buried insulating film 32, a channel region 25 between the source/drain regions 12, a gate insulating film 11 formed on the channel region 25, a floating gate electrode 13 formed on the gate insulating film 11, an intergate insulating film 14 formed on the floating gate electrode 13, and a control gate electrode 15 formed on the intergate insulating film 14.

FIG. 7B shows the schematic sectional structure, taken along the bit line extending direction (line I-I), of the NAND cell units of the nonvolatile semiconductor memory device according to the second embodiment of the invention in which diodes are employed as the select gates and the memory cell transistor has the stack gate structure. The NAND cell units are provided with a semiconductor substrate 10, a buried insulating film 32 formed on the semiconductor substrate 10, field isolation regions 8 formed on the buried insulating film 32, a DS cathode region 22 of a source-line-side diode DS formed on the buried insulating film 32, a DS anode region 21 formed on the DS cathode region 22, a contact plug 26 formed on the DS anode region 21, a metal electrode layer 27 formed on the contact plug 26 and connected to a source line STLi−1 which extends in the row direction, a drain region 12 formed on the buried insulating film 32, a contact plug 26 formed on the drain region 12, a metal electrode layer 28 formed on the contact plug 26, a DB anode region 18 formed on the metal electrode layer 28, a DB cathode region 19 formed on the DB anode region 18, a bit line 20 connected to the DB cathode region 19 and extending in the column direction, and a memory cell string connected to the DS cathode region 22 of the source-line-side diode DS and the drain region 12 that is connected to the DB anode region. The memory cell string includes plural memory cell transistors M10, M11, M12, and M13 having the stack gate structure which are connected in series via their source/drain regions 12. The above regions etc. are disposed between the field isolation regions 8.

In the nonvolatile semiconductor memory device according to the second embodiment of the invention, as shown in FIGS. 7A and 7B, the bit-line-side diode DB is used in common for the adjacent two memory cell strings in the column direction. That is, as shown in FIGS. 7A and 7B, the two memory cell strings each including the memory cell transistors M10, M11, M12, and M13 which are arranged in the column direction (i.e., bit line BL extending direction) are arranged symmetrically with respect to the bit-line-side diode DB. As such, the two memory cell strings are connected to the bit line BL via the common bit-line-side diode DB and disposed between the source lines STLi−1 and STLi.

NAND cell units each including the source line STL, the source-line-side diode DS, the memory cell transistors (M10, M11, M12, and M13), the bit-line-side diode DB, and the bit line BL as shown in FIGS. 7A and 7B may be layered via interlayer insulating films 34 in the direction perpendicular to the surface of the semiconductor substrate 10.

That is, plural memory cell transistors M20, M21, M22, and M23 are disposed above the plural memory cell transistors M10, M11, M12, and M13 via an interlayer insulating film 34, plural memory cell transistors M30, M31, M32, and M33 are disposed above the memory cell transistors M20, M21, M22, and M23 via an interlayer insulating film 34, and plural memory cell transistors M40, M41, M42, and M43 are disposed above the memory cell transistors M30, M31, M32, and M33 via an interlayer insulating film 34.

In the nonvolatile semiconductor memory device according to the second embodiment of the invention, word lines CG10, CG11, CG12, CG13, CG20, CG21, CG22, CG23, . . . , CG40, CG41, CG42, and CG43 which are connected to the control gate electrodes 15 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the contact plug 26 in the vertical direction.

On the bit line BL side, after an ohmic contact to the drain region 12 of the memory cell transistor M13 which is closest to the bit line BL is formed by the contact plug 26, the metal electrode layer 28 is formed on the contact plug 26 and the DB anode region 18 of a p-type silicon layer and the DB cathode region 19 of an n-type silicon layer are buried sequentially on the metal electrode layer 28. The bit-line-side diode DB is thus formed.

As described above, the occupation area of the NAND cell unit can be reduced by forming the source-line-side diode DS and the bit-line-side diode DB in the source-line-STL-side contact and the bit-line-BL-side contact, respectively.

The source-line-side diode DS located on the side of the source line STL may have a Schottky junction instead of a pn junction. Likewise, the bit-line-side diode DB which is located on the side of the bit line BL need not always be a pn-junction diode. Since the current direction at read may be one direction, the select element can be a diode instead of a MOS transistor. Since the diode is a two-terminal element, selection is made according to the voltage magnitude relationship between the source line STL and the bit line BL.

FIG. 7 shows a structure where an SOI substrate is used. In case where the source/drain regions 12 of the memory cell transistors do not reach the buried insulating film (BOX) 32 and a p-type region as a common back gate exists in the SOI substrate, connecting a back gate line BGL to this p-type region makes it possible to perform a batch erase operation as in the nonvolatile semiconductor memory device according to the first embodiment.

Figure 9:
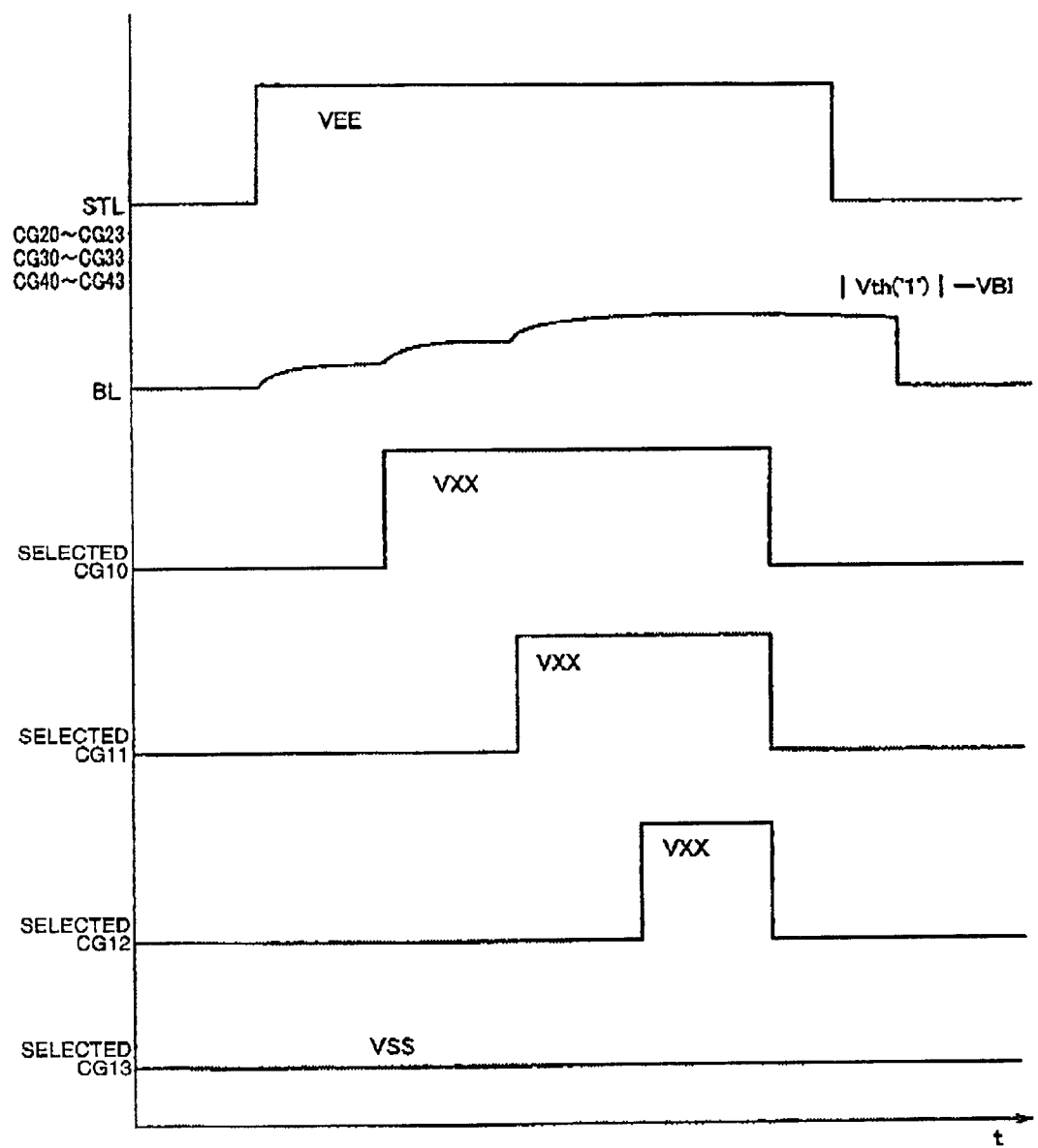
FIG. 9 shows operation waveforms in an erase operation, which conform to the operation voltage shown in FIG. 8, of the nonvolatile semiconductor memory device according to the second embodiment of the invention.

In case where the source/drain regions 12 of the memory cell transistors reach the buried insulating film 32 as shown in FIG. 7, particularly in an erase operation mode, it is difficult to supply a back gate potential to the channel regions 25 sandwiched between the source/drain regions 12 by connecting a back gate line BGL to them. In this case, as described later, the potential of the word line CG of the closest memory cell transistor M10 is increased to VXX and an operation waveform as shown in FIG. 9 is used.

(Example of Operation Voltage)

FIG. 8 shows an example of operation voltage states of NAND cell units of the nonvolatile semiconductor memory device according to the second embodiment of the invention which use the memory cell transistors having the stack gate structure.

For a selected memory cell string, FIG. 8 shows pulse voltage states of the bit line BL, the source line STL, a selected word line CG, and an unselected word line CG in respective operation modes of a read mode a "0"-write mode, a "1"-write mode, and an erase mode. Likewise, for an unselected memory cell string, FIG. 8 shows pulse voltage states of the bit line BL, the source line STL, and the word lines CG in respective operation modes of a read mode, a "0"-write mode, a "1"-write mode, and an erase mode. In FIG. 8, symbol VDD represents a power supply potential, VSS represents a ground potential, VRR represents a read voltage, VPP represents a write voltage, VEE represents an erase voltage, and VMM represents a bootstrap voltage. The voltage VRR is set higher than Vth('0') (a threshold voltage in a "0"-written state).

FIG. 9 shows operation waveforms in an erase operation which conform to the voltage shown in FIG. 8. In FIG. 9, symbol VBI represents a built-in potential of a pn junction. FIG. 9 shows pulse voltage applied to the source line STL, the word lines CG20-CG23, the word lines CG30-CG33, the word lines CG40-CG43, the bit line EL, the selected word line CG10, the selected word line CG11, the selected word line CG12, and the selected word line CG13. As shown in FIG. 9, the potential of the bit line SL is given by |Vth('1')|-VBI. The parameter Vth('1') represents a threshold voltage in a "1"-written state. The potential of the bit line EL has the waveform shown in FIG. 9 because the intermediate waveform depends on original threshold voltage of the respective memory cell transistors.

Figure 10:
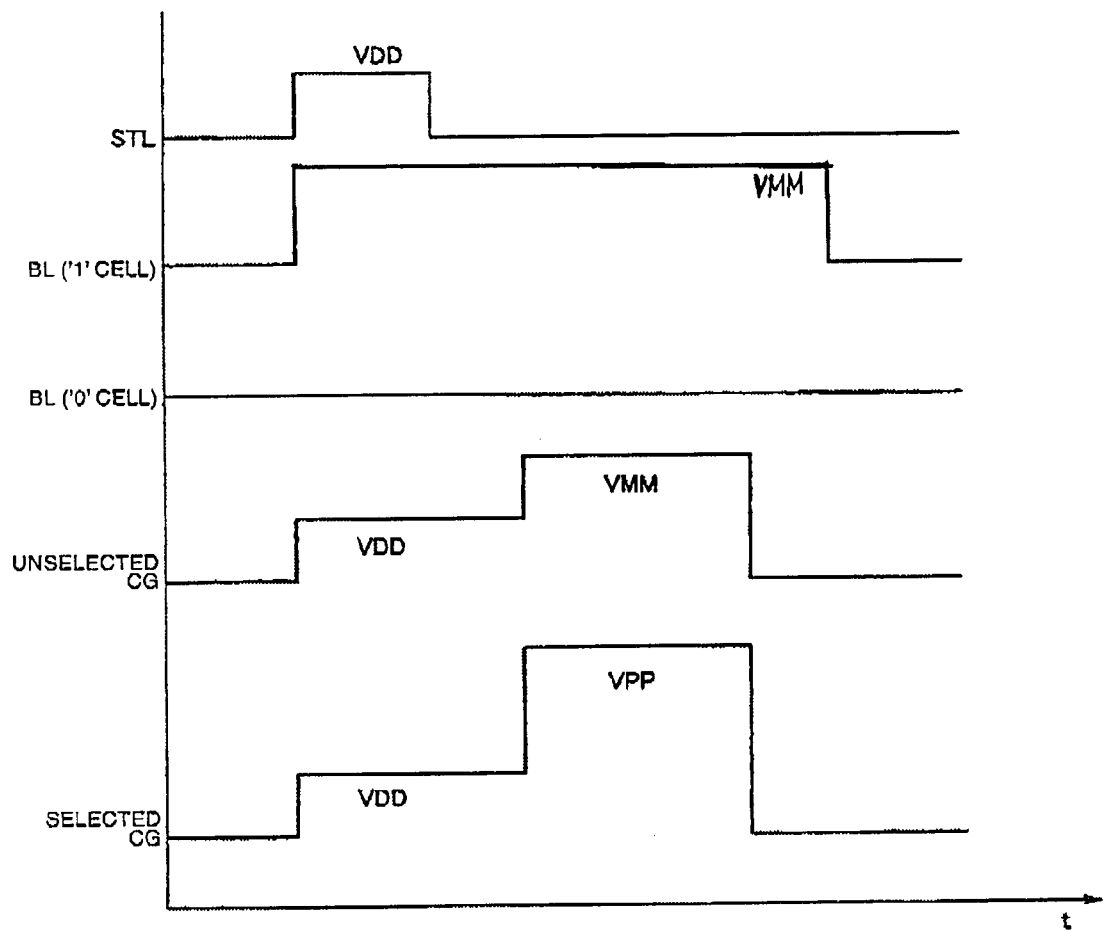
FIG. 10 shows operation waveforms in a write operation, which conform to the operation voltage shown in FIG. 8, of the nonvolatile semiconductor memory device according to the second embodiment of the invention.

FIG. 10 shows operation waveforms in a write operation which conform to the voltage shown in FIG. 8. FIG. 10 shows pulse voltage applied to the source line STL, the bit line BL of a "1"-write cell, the bit line BL of a "0"-write cell, an unselected word line CG, and a selected word line CG.

Figure 11:
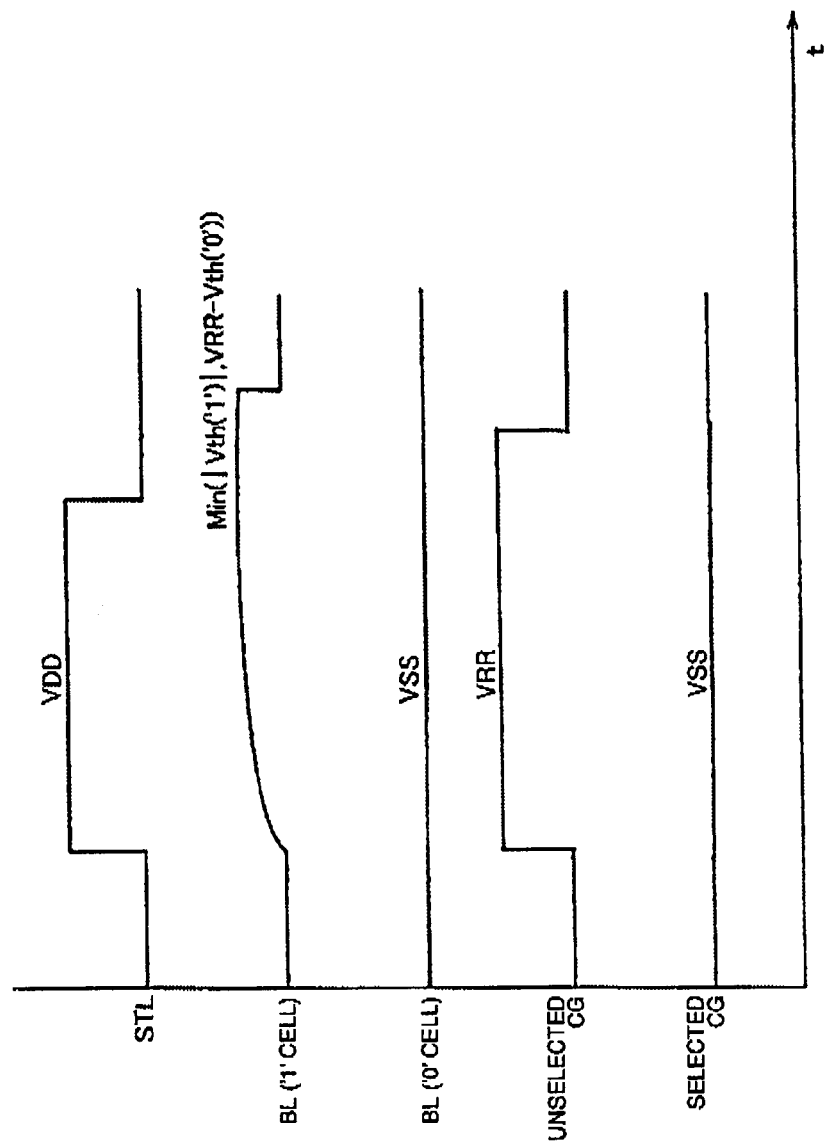
FIG. 11 shows operation waveforms in a read operation, which conform to the operation voltage shown in FIG. 8, of the nonvolatile semiconductor memory device according to the second embodiment of the invention.

FIG. 11 shows operation waveforms in a read operation which conform to the voltage shown in FIG. 8. FIG. 11 shows pulse voltage applied to the source line STL, the bit line BL of a "1"-written cell, the bit line EL of a "0"-written cell, an unselected word line CG, and a selected word line CG.

A read operation is performed as charging from the source line STL to the bit line EL. The potential of the bit line BL remains the ground potential VSS or changes to a high level "H" in accordance with the threshold value of a selected memory cell transistor. Such a voltage is judged by the sense amplifier S/A.

A write verify operation and an erase verify operation are basically the same as the read operation except for differences in potential relationships (for example, the potential of a selected word line CG is higher than 0 V in the case of the write verify operation and the potential of all the word lines CG in a selected memory cell string is 0 V in the case of the erase verify operation).

Write operation is performed in the following manner. To attain "1" write (an erased state is maintained) by self-boosting, the regions under the channels of a NAND cell unit is charged from the source line STL. Then, in the case of "0" write, the voltage of the bit line BL is set at 0 V for discharge and the channel potential is set at VBI (a built-in voltage of the BL-side diode, about 0.6V in the case of a silicon pn diode). In the case of "1" write, the bit line BL is given the power supply voltage VDD (high potential) for a pre-charged state is held, a selected word line CG is given the write voltage VPP, and the voltage of an unselected word line CG in a selected NAND string is increased to the bootstrap voltage VMM, whereby the channel potential is thus bootstrapped to a potential at which write is not caused.

The bootstrap voltage VMM is set at such a potential that "0" is not written to an unselected memory cell transistor in a selected NAND string when the channel potential is low, and that the channel potential of a "1"-written memory cell transistor is increased sufficiently and an erased state is thereby held. The precharge voltage for the source line STL may be set at the power supply voltage VDD. However, where the power supply voltage VDD is about 1.8 V, it is desirable that the precharge voltage for the source line STL be set at the bootstrap voltage VMM. No problem arises as long as the voltage of the bit line BL at the time of "1" write is such as to prevent a fall of a bootstrap potential. However, setting the voltage of the bit line BL at the time of "1" write comparable to the precharge voltage for the source line STL is advantageous in a sense that it dispenses with formation of an extra power circuit. For example, the bootstrap voltage VMM may be applied to the bit line BL at "1" write, instead of the power supply voltage VDD. An erase operation will be described below in detail.

First, an erase operation is performed by applying a high potential (VEE-VBI (a built-in voltage of the source-line-side diode DS)) to the source region of the memory cell transistor M10 which is closest to the source line STL, from the source line STL via the source-line-side diode DS. Then, the high potential is transferred to the drain region of the memory cell transistor M10. That is, the high potential is applied to the source region of the next memory cell transistor M11 to effect erasure. Then, the potential of the word line CG of the memory cell transistor M11 is increased to VXX, whereby the high potential is transferred to the drain region of the memory cell transistor M11. That is, the high potential is applied to the source region of the next memory cell transistor M12 to effect erasure. The above operation is performed repeatedly, whereby the data of the memory cell transistors M10, M11, M12, and M13 of the selected memory cell string are erased.

The voltage VXX is a voltage that allows transfer of a high potential (VEE-VBI) where VBI is the built-in voltage of the source-line-side diode DS. The voltage VEE is a voltage that allows a low potential to cause development of a sufficiently strong electric field in the semiconductor substrate 10 through capacitive coupling between the control gate electrode and the floating gate electrode.

It is assumed that the memory cell transistor is an nMOS transistor. It is apparent that the memory cell transistor may also be a pMOS transistor (the conductive type is reversed). In this case, the potential relationships and the anode/cathode positions of each diode are reversed.

The NAND nonvolatile semiconductor memory device according to the second embodiment of the invention makes it possible to miniaturize and simplify each memory cell unit by disposing diodes instead of select gate transistors and to improve the cutoff characteristic (i.e., improve the read characteristic) by forming the memory cell transistors using a thin semiconductor layer.

Third Embodiment (Stack Gate Structure)

Figure 12:
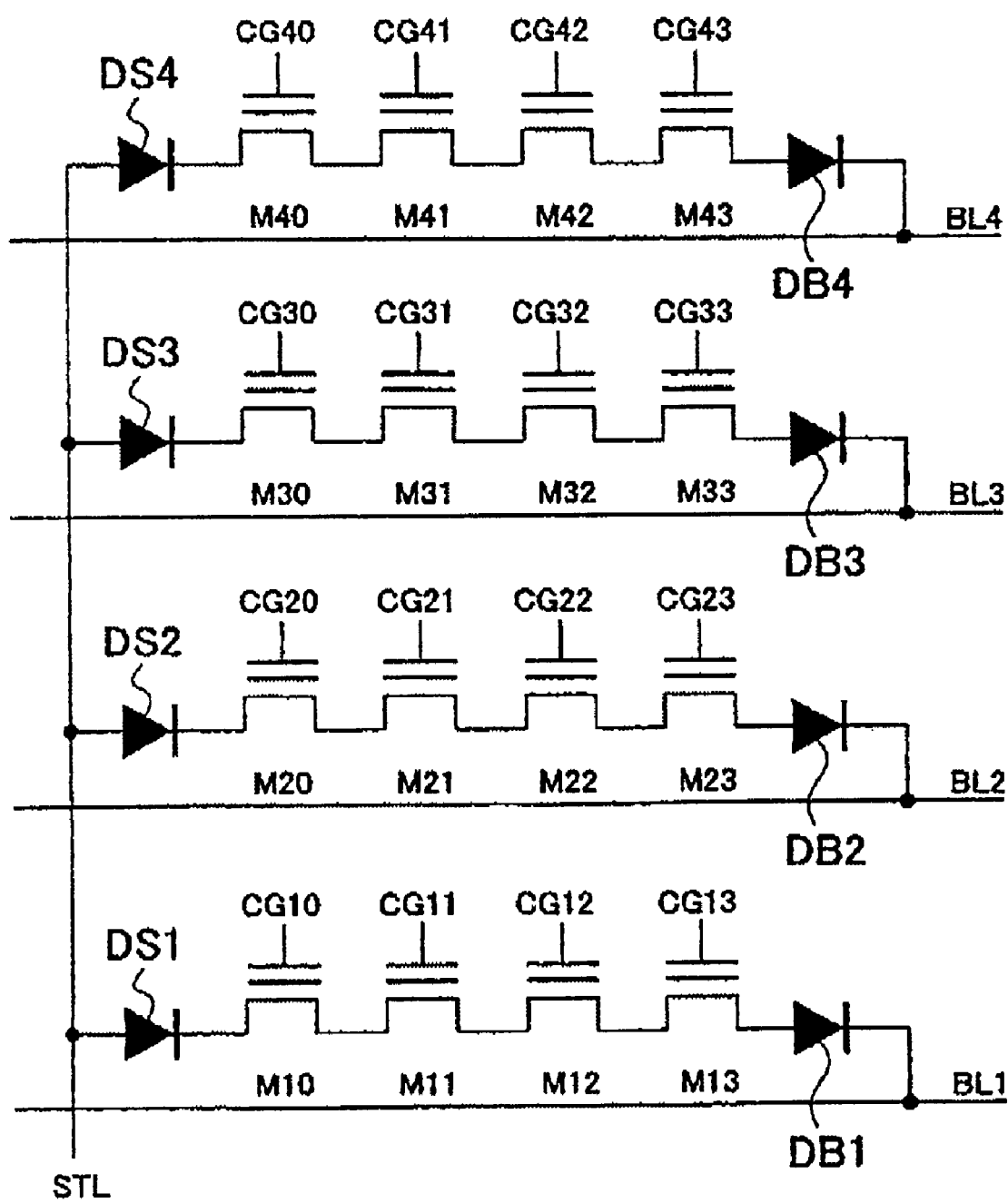
FIG. 12 shows a circuit configuration of layered NAND cell units (four layers) of a nonvolatile semiconductor memory device according to a third embodiment of the invention in which diodes are employed as select gates and the memory cell transistor has the stack gate structure.

FIG. 12 shows a schematic circuit configuration of layered NAND cell units (four layers) of a nonvolatile semiconductor memory device according to a third embodiment of the invention in which the memory cell transistor has the stack gate structure. The NAND cell units include a first source-line-side diode DS1 having an anode region connected to a source line STL, a first bit-line-side diode DB1 having a cathode region connected to a first bit line BL1, a first memory cell string which is connected between the cathode region of the first source-line-side diode DS1 and the anode region of the first bit-line-side diode DB1 and in which plural memory cell transistors M10, M11, M12, and M13 having the stack gate structure are connected in series via their source/drain regions, a second source-line-side diode DS2 having an anode region connected to the source line STL, a second bit-line-side diode DB2 having a cathode region connected to a second bit line BL2, a second memory cell string which is connected between the cathode region of the second sourceline-side diode DS2 and the anode region of the second bit-line-side diode DB2 and in which plural memory cell transistors M20, M21, M22, and M23 having the stack gate structure are connected in series via their source/drain regions, a third source-line-side diode DS3 having an anode region connected to the source line STL, a third bit-line-side diode DB3 having a cathode region connected to a third bit line BL3, a third memory cell string which is connected between the cathode region of the third source-line-side diode DS3 and the anode region of the third bit-line-side diode DB3 and in which plural memory cell transistors M30, M31, M32, and M33 having the stack gate structure are connected in series via their source/drain regions, a fourth source-line-side diode DS4 having an anode region connected to the source line STL, a fourth bit-line-side diode DB4 having a cathode region connected to a fourth bit line BL4, and a fourth memory cell string which is connected between the cathode region of the fourth source-line-side diode DS4 and the anode region of the fourth bit-line-side diode DB3 and in which plural memory cell transistors M40, M41, M42, and M43 having the stack gate structure are connected in series via their source/drain regions.

(SONOS Structure)

Figure 13:
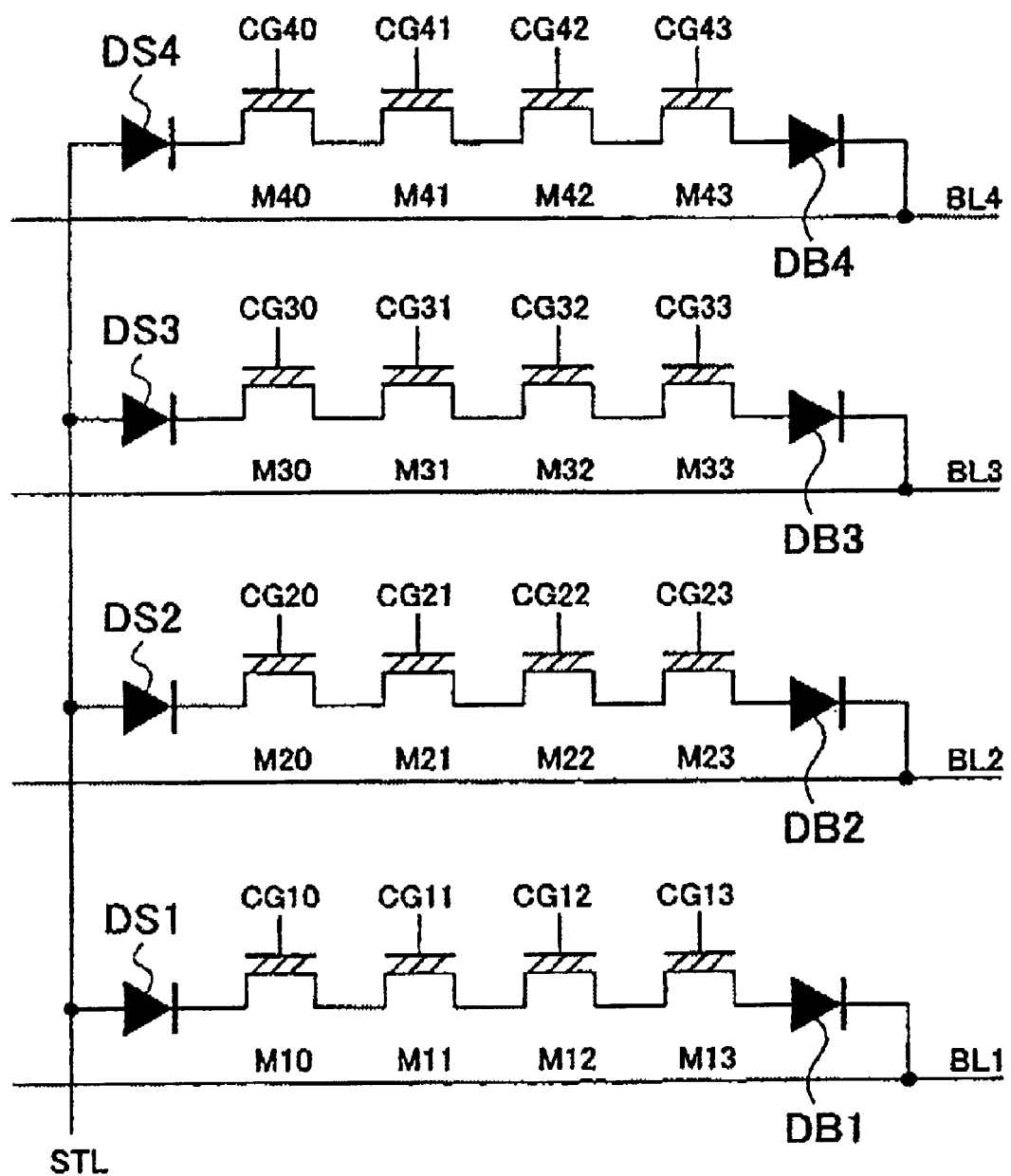
FIG. 13 shows a circuit configuration of layered NAND cell units (four layers) of a nonvolatile semiconductor memory device according to the third embodiment of the invention in which diodes are employed as select gates and the memory cell transistor has the SONOS structure.

FIG. 13 shows a schematic circuit configuration of layered NAND cell units (four layers) of a nonvolatile semiconductor memory device according to a third embodiment of the invention in which the memory cell transistor has the SONOS structure. The NAND cell units include a first source-line-side diode DS1 having an anode region connected to a source line STL, a first bit-line-side diode DB1 having a cathode region connected to a first bit line BL1, a first memory cell string which is connected between the cathode region of the first source-line-side diode DS1 and the anode region of the first bit-line-side diode DB1 and in which plural memory cell transistors M10, M11, M12, and M13 having the SONOS structure are connected in series via their source/drain regions, a second source-line-side diode DS2 having an anode region connected to the source line STL, a second bit-line-side diode DS2 having a cathode region connected to a second bit line BL2, a second memory cell string which is connected between the cathode region of the second source-line-side diode DS2 and the anode region of the second bit-line-side diode DB2 and in which plural memory cell transistors M20, M21, M22, and M23 having the SONOS structure are connected in series via their source/drain regions, a third source-line-side diode DS3 having an anode region connected to the source line STL, a third bit-line-side diode DB3 having a cathode region connected to a third bit line BL3, a third memory cell string which is connected between the cathode region of the third source-line-side diode DS3 and the anode region of the third bit-line-side diode DB3 and in which plural memory cell transistors M30, M31, M32, and M33 having the SONOS structure are connected in series via their source/drain regions, a fourth source-line-side diode DS4 having an anode region connected to the source line STL, a fourth bit-line-side diode DB4 having a cathode region connected to a fourth bit line BL4, and a fourth memory cell string which is connected between the cathode region of the fourth source-line-side diode DS4 and the anode region of the fourth bit-line-side diode DB3 and in which plural memory cell transistors M40, M41, M42, and M43 having the SONOS structure are connected in series via their source/drain regions.

In the first to fourth memory cell strings of the nonvolatile semiconductor memory device according to the third embodiment of the invention, control gate electrodes of the respective memory cell transistors are connected to different word lines CG10, CG11, CG12, CG13, CG20, CG21, CG22, CG23, CG40, CG41, CG42, and CG43.

In the nonvolatile semiconductor memory device according to the third embodiment of the invention, the first to fourth memory cell strings are disposed in the four layers which are insulated from each other by interlayer insulating films. Therefore, the sixteen (16) series-connected NAND memory cell transistors can be realized in such a manner as to have the same occupation area as four series-connected NAND memory cell transistors do.

In the nonvolatile semiconductor memory device according to the third embodiment of the invention, the number of series-connected memory cell transistors in each memory cell string is not limited to four. The number of layers is not limited to four either. For example, to realize high-speed read, each memory cell string may be formed by only one memory cell transistor.

In the nonvolatile semiconductor memory device according to the third embodiment of the invention, each of the source-line-side diodes DS1-DS4 is formed in the direction perpendicular to the semiconductor substrate and each of the bit-line-side diodes DB1-DB4 is also done so. For example, each of the source-line-side diodes DS1-DS4 may exist in a contact for connecting the source line STL and the associated memory cell string. For example, each of the bit-line-side diodes DB1-DD4 may exist in a contact for connecting the associated bit line BL and the associated memory cell string.

(Device Structure)

In the nonvolatile semiconductor memory device according to the third embodiment of the invention, the storage capacity is increased by layering the memory cell transistors M10, M11, . . . , M42, and M43 formed in the interlayer insulating films 34. However, to attain "1" write (an erased state is maintained) by self-boosting, the cutoff characteristics of the source-line-side diode DS and the bit-line-side diode BD are important. Furthermore, to save the diode formation spaces and thereby increase the integration density, it is desirable that each of the source-line-side diode DS and the bit-line-side diode BD be formed in the vertical direction.

The memory cell transistors M10, M11, . . . , M42, and M43 which are layered so as to be formed in the interlayer insulating films 34 are TFTs. Source/drain regions 12 and channel regions 25 of the memory cell transistors M10, M11, . . . , M42, and M43 can be formed by re-crystallizing deposited amorphous silicon or polysilicon by a laser annealing technique or the like. Alternatively, Source/drain regions 12 and channel regions 25 of the memory cell transistors M10, M11, M42, and M43 can be formed by using deposited amorphous silicon or polysilicon as it is. This is because satisfactory results are obtained as long as electrons or holes are accumulated at trap levels in the case where the memory cell transistors M10, M11, . . . , M42, and M43 have the ONO gate structure or in the floating gate electrode layer in the case where they have the floating gate structure and the threshold value is thereby varied.

Figure 14A:
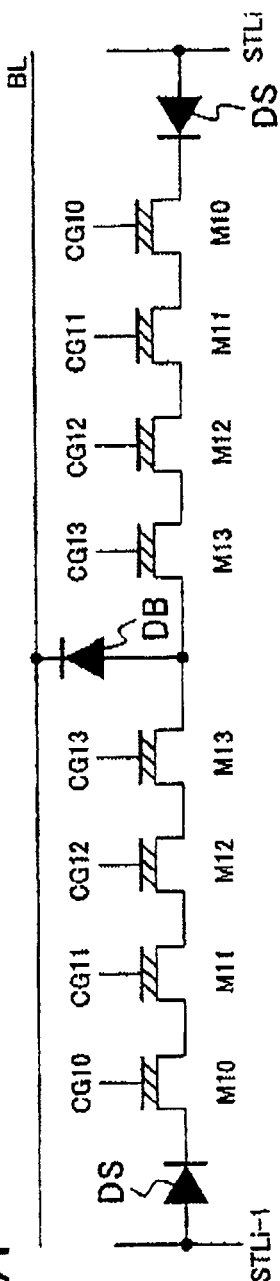
FIGS. 14A and 14B show a schematic circuit configuration and a schematic sectional structure, taken along the bit line extending direction (line I-I), of one layer of layered NAND cell units of the nonvolatile semiconductor memory device according to the third embodiment of the invention in which diodes are employed as the select gates and the memory cell transistor has a SONOS/TFT structure.
Figure 14B:
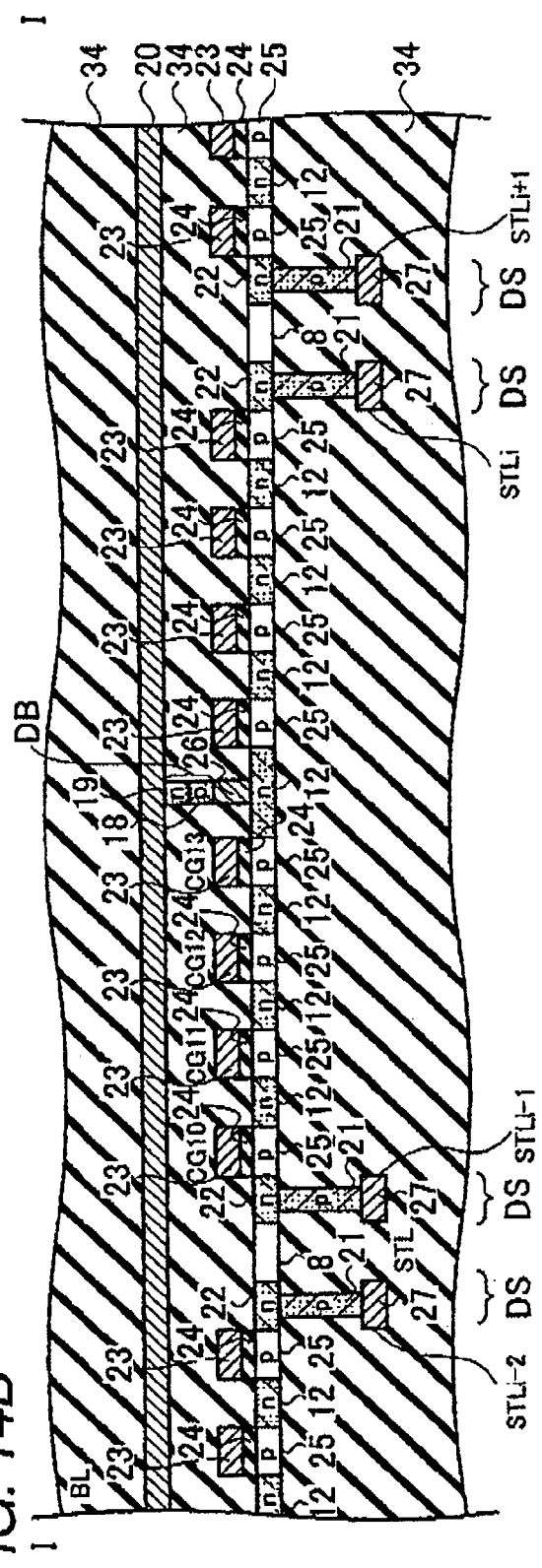

In case where a single crystal is formed by performing laser annealing or the like on amorphous silicon or polysilicon, a structure shown in FIG. 14B having a SONOS/TFT structure and shallow source/drain regions 12 can be produced more easily.

In case where amorphous silicon or polysilicon is used, nitriding may be performed to suppress generation of dangling bonds. Therefore, an SNONONS structure may be employed. A SANOS structure may also be employed in which an alumna ($Al_2O_3$) film having large relative permittivity is used instead of the control-gate-side silicon oxide film. Furthermore, a MONOS structure or a MANOS structure using a metal control gate may be employed. Although it is assumed in this embodiment that the TFT as the memory cell transistor is of an n-channel type, it may be of a p-channel type. In the latter case, potential relationships and anode/cathode positions of each of the source-line-side diode DS and the bit-line-side diode DB, which will be described later, are reversed.

Although the following description of the nonvolatile semiconductor memory device according to the third embodiment of the invention will be directed to an example in which the memory cell transistor is a TFT having the SONOS structure, memory cell transistors can be layered in a similar manner also in case of TFTs having the stack gate structure.

In the nonvolatile semiconductor memory device according to the third embodiment of the invention, the memory cell unit is simplified by employing diodes instead of select gate transistors.

FIG. 14A and 14B show a circuit configuration and a schematic sectional structure of 4-NAND-cell units in which diodes are employed as the select elements instead of MOS transistors and the memory cell transistor has the SONOS/TFT structure. It is assumed that the memory cell transistor is an nMOS transistor. It is apparent that the memory cell transistor may also be a pMOS transistor (the conductive type is reversed). In this case, the potential relationships and the anode/cathode positions of each diode are reversed.

FIGS. 14A and 14B show, as an example, a particular layer of the layers of memory cell transistors in the nonvolatile semiconductor memory device according to the third embodiment of the invention. Although not shown in any drawings, the positional relationship between the source/drain regions 12 and the control gate electrode 23 may be changed.

FIG. 14A shows the schematic circuit configuration of the NAND cell units of the nonvolatile semiconductor memory device according to the third embodiment of the invention in which diodes are employed as the select gates and the memory cell transistor has the SONOS/TFT structure. The NAND cell units are provided with a source-line-side diode DS having an anode region connected to a source line STLi−1, a bit-line-side diode DB having a cathode region connected to a bit line BL, a memory cell string which is connected between the cathode region of the source-line-side diode DS and the anode region of the bit-line-side diode DB and in which plural memory cell transistors M10, M11, M12, and M13 having the SONOS/TFT structure are connected in series via their source/drain regions 12, a source-line-side diode DS having an anode region connected to a source line STLi, and a memory cell string which is connected between the cathode region of the source-line-side diode DS and the anode region of the bit-line-side diode DB and in which plural memory cell transistors M10, M11, M12, and M13 having the SONOS/TFT structure are connected to each other in series via their source/drain regions 12.

As shown in FIG. 14B, the memory cell transistor 1o used in the nonvolatile semiconductor memory device according to the third embodiment of the invention has a SONOS/TFT structure including an interlayer insulating film 34, source/drain regions 12 formed in the interlayer insulating film 34, a channel region 25 between the source/drain regions 12, an ONO insulating film 24 formed on the channel region 25, and a control gate electrode 23 formed on the ONO insulating film 24.

FIG. 14B shows the schematic sectional structure, taken along the bit line extending direction (line I-I), of the NAND cell units of the nonvolatile semiconductor memory device according to the third embodiment of the invention in which diodes are employed as the select gates and the memory cell transistor has the SONOS/TFT structure. The NAND cell units are provided with an interlayer insulating film 34, field isolation regions 8 formed in the interlayer insulating film 34, a DS cathode region 22 of a source-line-side diode DS formed in the interlayer insulating film 34, a DS anode region 21 formed underneath the DS cathode region 22, a metal electrode layer 27 formed underneath the DS anode region 21 and connected to a source line STLi−1 which extends in the row direction, a drain region 12 formed in the interlayer insulating film 34, a contact plug 26 formed on the drain region 12, a DB anode region 18 formed on the contact plug 26, a DB cathode region 19 formed on the DB anode region 18, a bit line 20 connected to the DB cathode region 19 and extending in the column direction, and a memory cell string which is connected between the DS cathode region 22 of the source-line-side diode DS and the drain region 12 that is connected to the DB anode region 18 and in which plural memory cell transistors M10, M11, M12, and M13 having the SONOS/TFT structure are connected in series via their source/drain regions 12. The above regions etc. are disposed between the field isolation regions 8.

In the nonvolatile semiconductor memory device according to the third embodiment of the invention, as shown in FIGS. 14A and 14B, the bit-line-side diode DB is used in common for the adjacent two memory cell strings in the column direction. That is, as shown in FIGS. 14A and 14B, the two memory cell strings each including the memory cell transistors M10, M11, M12, and M13 which are arranged in the column direction (i.e., bit line BL extending direction) are arranged symmetrically with respect to the bit-line-side diode DB. As such, the two memory cell strings are connected to the bit line BL via the common bit-line-side diode DB and disposed between the source lines STLi−1 and STLi.

The NAND cell units each including the source line STL, the source-line-side diode DS, the memory cell transistors (M10, M11, M12, and M13), the bit-line-side diode DB, and the bit line BL as shown in FIGS. 14A and 14B are layered in the vertical direction via the interlayer insulating films 34.

That is, the plural memory cell transistors M20, M21, M22, and M23 are disposed above the plural memory cell transistors M10, M11, M12, and M13 via the interlayer insulating film 34, the plural memory cell transistors M30, M31, M32, and M33 are disposed above the memory cell transistors M20, M21, M22, and M23 via the interlayer insulating film 34, and the plural memory cell transistors M40, M41, M42, and M43 are disposed above the memory cell transistors M30, M31, M32, and M33 via the interlayer insulating film 34.

In the nonvolatile semiconductor memory device according to the third embodiment of the invention, the word lines CG10, CG11, CG12, CG13, CG20, CG21, CG22, CG23, . . . , CG40, CG41, CG42, and CG43 which are connected to the control gate electrodes 23 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the metal electrode layer 27 in the vertical direction.

On the bit line BL side, after an ohmic contact to the drain region 12 of the memory cell transistor M13 which is closest to the bit line BL is formed by the contact plug 26, the DB anode region 18 of a p-type silicon layer and the DB cathode region 19 of an n-type silicon layer are buried sequentially on the contact plug 26. The bit-line-side diode DB is thus formed.

As described above, the occupation area of the NAND cell unit can be reduced by forming the source-line-side diode DS and the bit-line-side diode DB in the source-line-side contact and the bit-line-side contact, respectively.

The source-line-side diode DS located on the side of the source line STL may have a Schottky junction instead of a pn junction. Likewise, the bit-line-side diode DB which is located on the side of the bit line BL need not always be a pn-junction diode. Since the current direction at read may be one direction, the select element can be a diode instead of a MOS transistor. Since the diode is a two-terminal element, selection is made according to the voltage magnitude relationship between the source line STL and the bit line BL.

(Example of Operation Voltage)

FIG. 15 shows an example of operation voltage states of NAND cell units of the nonvolatile semiconductor memory device according to the third embodiment of the invention which use the memory cell transistors having the SONOS/TFT structure.

For a selected memory cell string, FIG. 15 shows pulse voltage states of the bit line BL, the source line STL, a selected word line CG, and an unselected word line CG in respective operation modes of a read mode, a "0"-write mode, a "1"-write mode, and an erase mode. Likewise, for an unselected memory cell string, FIG. 15 shows pulse voltage states of the bit line BL, the source line STL, and the word lines CG in respective operation modes of a read mode, a "0"-write mode, a "1"-write mode, and an erase mode. In FIG. 15, symbol VDD represents a power supply potential, VSS represents a ground potential, VRR represents a read voltage, VPP represents a write voltage, VEE represents an erase voltage, and VMM represents a bootstrap voltage. The voltage VRR is set higher than Vth('0') (a threshold voltage in a "0"-written state).

Operation waveforms in an erase operation which conform to the voltage shown in FIG. 15 are the same as shown in FIG. 9. FIG. 9 shows pulse voltage applied to the source line STL, the word lines CG20-CG23, the word lines CG30-CG33, the word lines CG40-CG43, the bit line BL, the selected word line CG10, the selected word line CG11, the selected word line CG12, and the selected word line CG13. As shown in FIG. 9, the potential of the bit line BL is given by |Vth('1')|-VBI. The parameter Vth('1') represents a threshold voltage in a "1"-written state. The potential of the bit line BL has the waveform shown in FIG. 9 because the intermediate waveform depends on original threshold voltage of the respective memory cell transistors.

Operation waveforms in a write operation which conform to the voltage shown in FIG. 15 are the same as shown in FIG. 10. FIG. 10 shows pulse voltage applied to the source line STL, the bit line BL of a "1"-write cell, the bit line BL of a "0"-write cell, an unselected word line CG, and a selected word line CG.

Operation waveforms in a read operation which conform to the voltage shown in FIG. 15 are the same as shown in FIG. 11. FIG. 11 shows pulse voltage applied to the source line STL, the bit line EL of a "1"-written cell, the bit line BL of a "0"-written cell, an unselected word line CG, and a selected word line CG.

A read operation is performed as charging from the source line STL to the bit line BL. The potential of the bit line BL remains the ground potential VSS or changes to a high level "H" in accordance with the threshold value of a selected memory cell transistor. Such a voltage is judged by the sense amplifier S/A.

A write verify operation and an erase verify operation are basically the same as the read operation except for differences in potential relationships (for example, the potential of a selected word line CG is higher than 0 V in the case of the write verify operation and the potential of all the word lines CG in a selected memory cell string is 0 V in the case of the erase verify operation).

Write operation is performed in the following manner. To attain "1" write (an erased state is maintained) by self-boosting, the regions under the channels of a NAND cell unit is charged from the source line STL. Then, in the case of "0" write, the voltage of the bit line BL is set at 0 V and the channel potential is set at VB1 (a built-in voltage of the BL-side diode, about 0.6 V in the case of a silicon pn diode). In the case of "1" write, the bit line BL is given the power supply voltage VDD (high potential) for a pre-charged state is held, a selected word line CG is given the write voltage VPP and the voltage of an unselected word line CG in a selected NAND string is increased to the bootstrap voltage VMM, whereby the channel potential is thus bootstrapped to a potential at which write is not caused.

The bootstrap voltage VMM is set at such a potential that "0" is not written to an unselected memory cell transistor in a selected NAND string when the channel potential is low, and that the channel potential of a "1"-written memory cell transistor is increased sufficiently and an erased state is thereby held. The precharge voltage for the source line STL may be set at the power supply voltage VDD. However, where the power supply voltage VDD is about 1.8 V, it is desirable that the precharge voltage for the source line STL be set at the bootstrap voltage VMM. No problem arises as long as the voltage of the bit line BL at the time of "1" write is such as to prevent a fall of a bootstrap potential. However, setting the voltage of the bit line BL at the time of "1" write comparable to the precharge voltage for the source line STL is advantageous in a sense that it dispenses with formation of an extra power circuit. For example, the bootstrap voltage VMM may be applied to the bit line BL at "1" write, instead of the power supply voltage VDD. An erase operation will be described below in detail.

First, an erase operation is performed by applying a high potential (VEE-VBI (a built-in voltage of the source-line-side diode DS)) to the source region of the memory cell transistor M10 which is closest to the source line STL, from the source line STL via the source-line-side diode DS. Then, the high potential is transferred to the drain region of the memory cell transistor M10. That is, the high potential is applied to the source region of the next memory cell transistor M11 to effect erasure. Then, the potential of the word line CG of the memory cell transistor M11 is increased to VXX, whereby the high potential is transferred to the drain region of the memory cell transistor M11. That is, the high potential is applied to the source region of the next memory cell transistor M12 to effect erasure. The above operation is performed repeatedly, whereby the data of the memory cell transistors M10, M11, M12, and M13 of the selected memory cell string are erased.

The voltage VXX is a voltage that allows transfer of a high potential (VEE-VBI) where VBI is the built-in voltage of the source-line-side diode DS. The voltage VEE is a voltage that allows a low potential to cause development of a sufficiently strong electric field in the semiconductor substrate 10 through capacitive coupling between the control gate electrode and the charge trap levels in the ONO insulating film 24.

Figure 16:
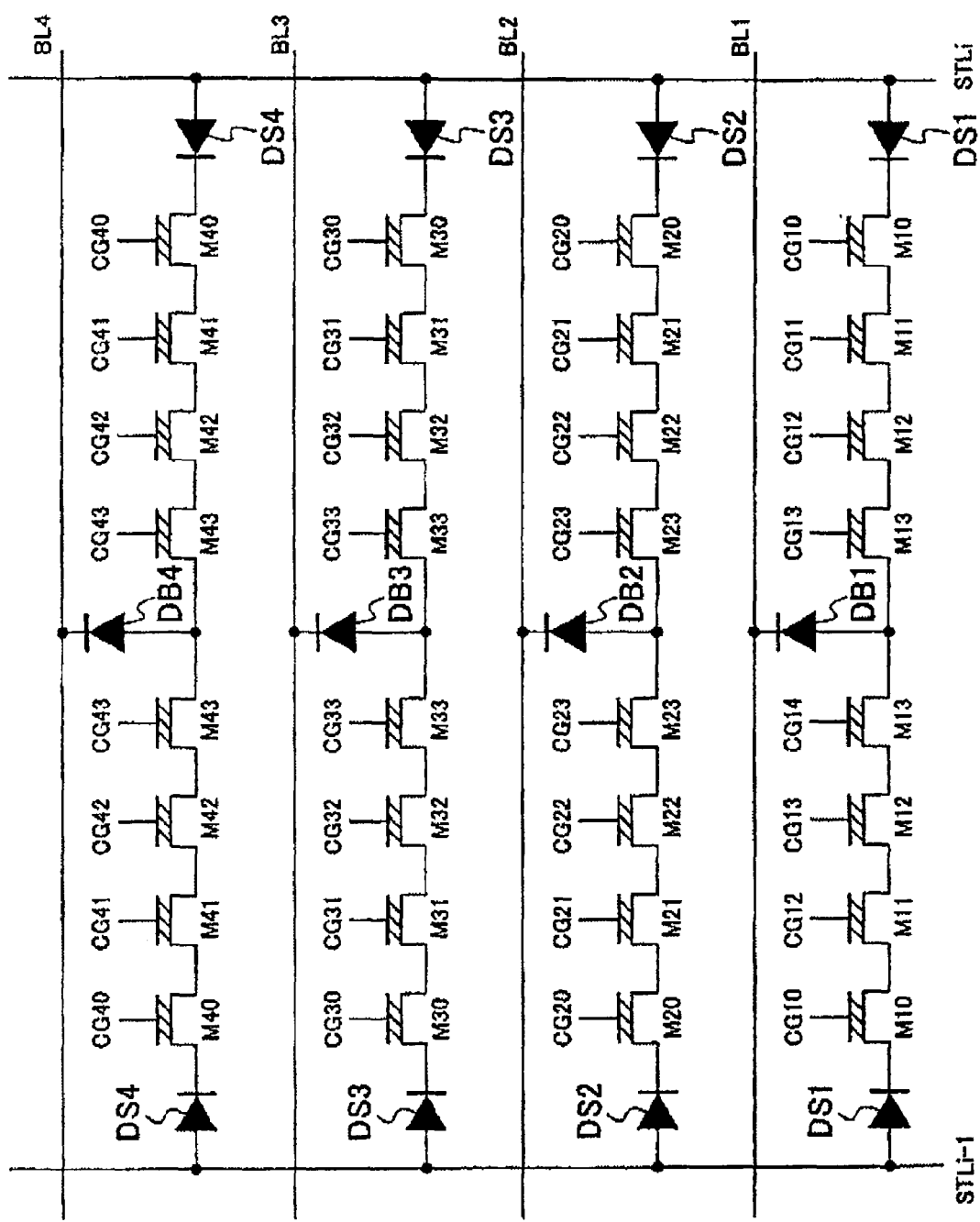
FIG. 16 shows a schematic circuit configuration of layered NAND cell units (four layers) of a nonvolatile semiconductor memory device according to the third embodiment of the invention in which diodes are employed as the select gates and the memory cell transistor has the SONOS/TFT structure.

FIG. 16 shows a schematic circuit configuration of layered NAND cell units (four layers) of a nonvolatile semiconductor memory device according to the third embodiment of the invention in which diodes are employed as the select gates and the memory cell transistor has the SONOS/TFT structure. The first layer is provided with a source-line-side diode DS1 having an anode region connected to a source line STLi–1, a bit-line-side diode DB1 having a cathode region connected to a bit line BL1, a memory cell string which is connected between the cathode region of the source-line-side diode DS1 and the anode region of the bit-line-side diode DB1 and in which plural memory cell transistors M10, M11, M12, and M13 having the SONOS/TFT structure are connected in series via their source/drain regions 12, a source-line-side diode DS1 having anode region connected to a source line STLi, and a memory cell string which is connected between the cathode region of the source-line-side diode DS1 and the anode region of the bit-line-side diode DB1 and in which plural memory cell transistors M10, M11, M12, and M13 having the SONOS/TFT structure are connected in series via their source/drain regions 12.

The second layer is provided with a source-line-side diode DS2 having an anode region connected to the source line STLi–1, a bit-line-side diode DB2 having a cathode region connected to a bit line BL2, a memory cell string which is connected between the cathode region of the source-line-side diode DS2 and the anode region of the bit-line-side diode DB2 and in which plural memory cell transistors M20, M21, M22, and M23 having the SONOS/TFT structure are connected in series via their source/drain regions 12, a source-line-side diode DS2 having an anode region connected to the source line STLi, and a memory cell string which is connected between the cathode region of the source-line-side diode DS2 and the anode region of the bit-line-side diode DB2 and in which plural memory cell transistors M20, M21, M22, and M23 having the SONOS/TFT structure are connected in series via their source/drain regions 12.

The third layer is provided with a source-line-side diode DS3 having an anode region connected to the source line STLi–1, a bit-line-side diode DB3 having a cathode region connected to a bit line BL3, a memory cell string which is connected between the cathode region of the source-line-side diode DS3 and the anode region of the bit-line-side diode DB3 and in which plural memory cell transistors M30, M31, M32, and M33 having the SONOS/TFT structure are connected in series via their source/drain regions 12, a source-line-side diode DS3 having an anode region connected to the source line STLi, and a memory cell string which is connected between the cathode region of the source-line-side diode DS3 and the anode region of the bit-line-side diode DB3 and in which plural memory cell transistors M30, M31, M32, and M33 having the SONOS/TFT structure are connected in series via their source/drain regions 12.

The fourth layer is provided with a source-line-side diode DS4 having an anode region connected to the source line STLi–1, a bit-line-side diode DB4 having a cathode region connected to a bit line BL4, a memory cell string which is connected between the cathode region of the source-line-side diode DS4 and the anode region of the bit-line-side diode DB4 and in which plural memory cell transistors M40, M41, M42, and M43 having the SONOS/TFT structure are connected in series via their source/drain regions 12, a source-line-side diode DS4 having an anode region connected to the source line STLi, and a memory cell string which is connected between the cathode region of the source-line-side diode DS4 and the anode region of the bit-line-side diode DB4 and in which plural memory cell transistors M40, M41, M42, and M43 having the SONOS/TFT structure are connected in series via their source/drain regions 12.

Figure 17:
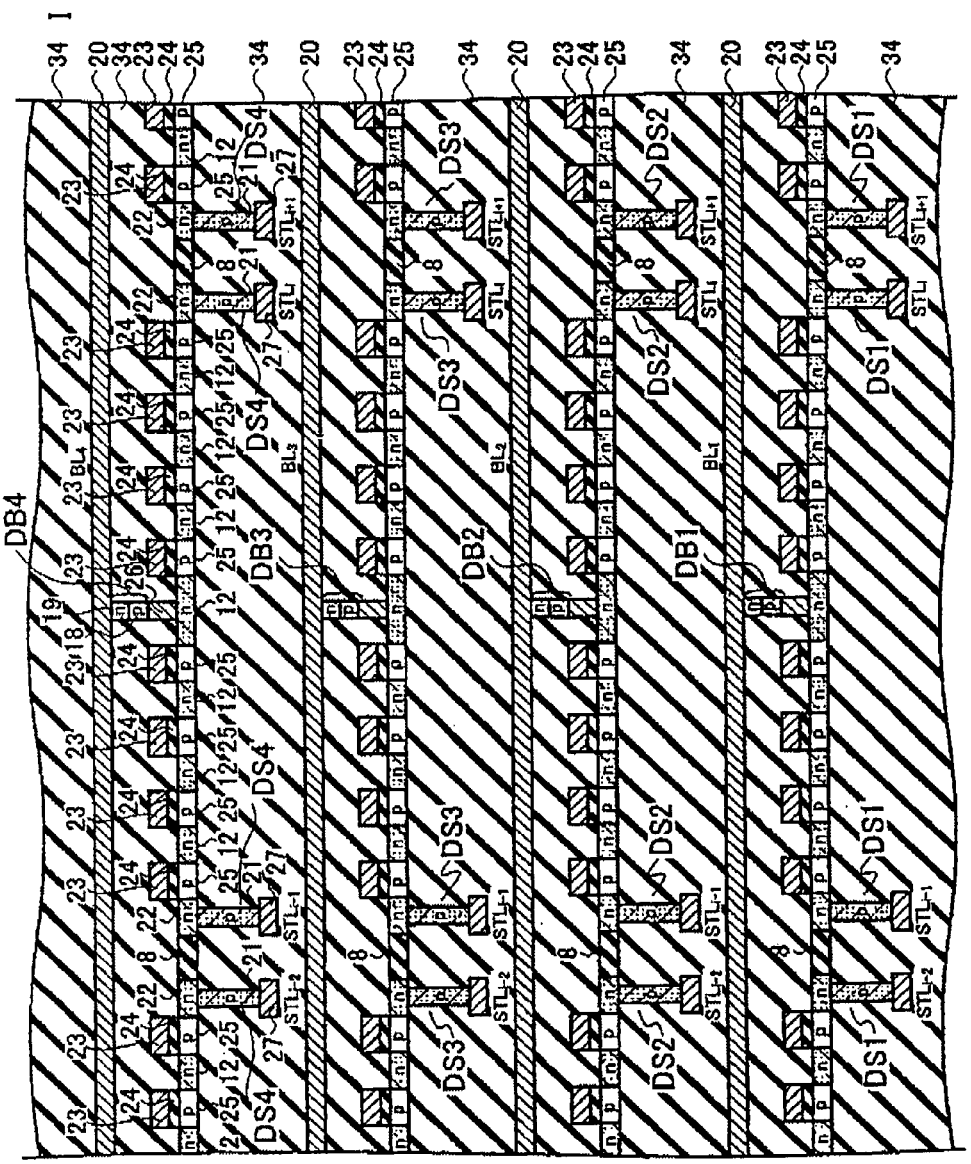
FIG. 17 shows a schematic sectional structure, taken along the bit line extending direction (line I-I), of the layered NAND cell units (four layers) of the nonvolatile semiconductor memory device according to the third embodiment of the invention in which diodes are employed as the select gates and the memory cell transistor has the SONOS/TFT structure.

FIG. 17 shows a schematic sectional structure, taken along the bit line extending direction (line I-I), of the layered NAND cell units (four layers) of the nonvolatile semiconductor memory device according to the third embodiment of the invention in which diodes are employed as the select gates and the memory cell transistor has the SONOS/TFT structure. In FIG. 17, four layers of the structure shown in FIG. 14B are laid one on another via the interlayer insulating films 34.

Modification of Third Embodiment

Figure 18:
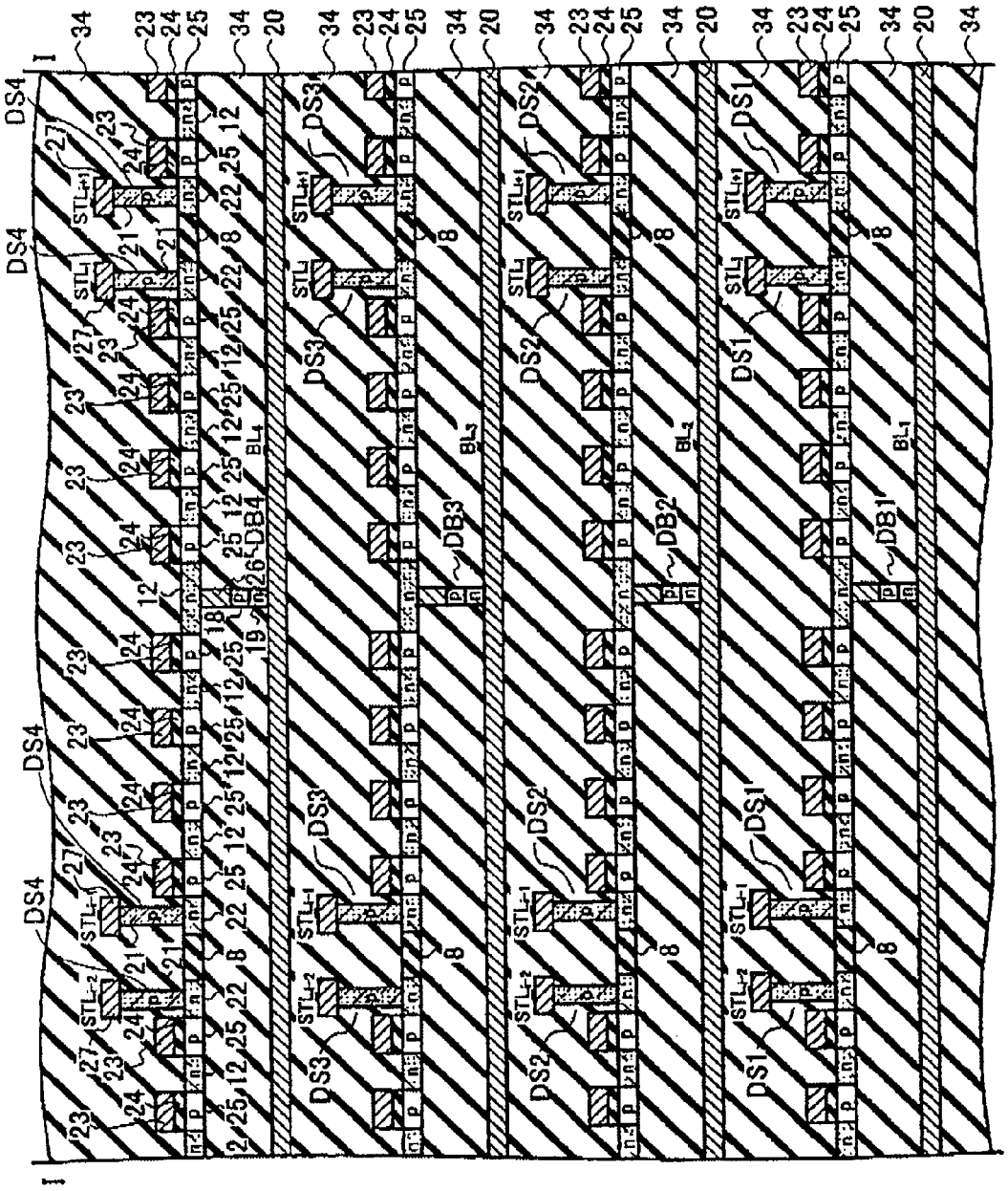
FIG. 18 shows a schematic sectional structure, taken along the bit line extending direction (line I-I), of layered NAND cell units (four layers) of a nonvolatile semiconductor memory device according to a modification of the third embodiment of the invention in which the positional relationship between the bit line BL and the source line STL is opposite to that of the structure shown in FIG. 17.

FIG. 18 shows a schematic sectional structure, taken along the bit line extending direction (line I-I), of layered NAND cell units (four layers) of a nonvolatile semiconductor memory device according to a modification of the third embodiment of the invention in which the positional relationship between the bit line BL and the source line STL is opposite to that of the structure shown in FIG. 17.

As shown in the schematic sectional view of FIG. 18 taken along line I-I, one layer of the NAND cell units of the nonvolatile semiconductor memory device according to the modification of the third embodiment of the invention in which the memory transistor cell has the SONOS/TFT structure is provided with an interlayer insulating film 34, field isolation regions 8 formed in the interlayer insulating film 34, a DS cathode region 22 of a source-line-side diode DS formed in the interlayer insulating film 34, a DS anode region 21 formed on the DS cathode region 22, a metal electrode layer 27 formed on the DS anode region 21 and connected to a source line STLi–1 which extends in the row direction, a drain region 12 formed in the interlayer insulating film 34, a contact plug 26 formed underneath the drain region 12, a DB anode region 18 formed underneath the contact plug 26, a DB cathode region 19 formed underneath the DB anode region 18, a bit line 20 connected to the DB cathode region 19 and extending in the column direction, and a memory cell string which is connected between the DS cathode region 22 of the source-line-side diode DS and the drain region 12 that is connected to the DB anode region 18 and in which plural memory cell transistors M10, M11, M12, and M13 having the SONOS/TFT structure are connected in series via their source/drain regions 12. The above regions etc. are disposed between the field isolation regions 8.

In the nonvolatile semiconductor memory device according to the modification of the third embodiment of the invention, as shown in FIG. 18, the bit-line-side diode DB is used in common for the adjacent two memory cell strings in the column direction. That is, as shown in FIG. 18, the two memory cell strings each including the memory cell transistors M10, M11, M12, and M13 which are arranged in the column direction (i.e., bit line BL extending direction) are arranged symmetrically with respect to the bit-line-side diode DB. As such, the two memory cell strings are connected to the bit line BL via the common bit-line-side diode DB.

As shown in FIG. 18, the NAND cell units each including the source line STL, the source-line-side diode DS, the memory cell transistors (M10, M11, M12, and M13), the bit-line-side diode DB, and the bit line BL are layered in the vertical direction via the interlayer insulating films 34.

That is, the plural memory cell transistors M20, M21, M22, and M23 are disposed above the plural memory cell transistors M10, M11, M12, and M13 via the interlayer insulating film 34, the plural memory cell transistors M30, M31, M32, and M33 are disposed above the memory cell transistors M20, M21, M22, and M23 via the interlayer insulating film 34, and the plural memory cell transistors M40, M41, M42, and M43 are disposed above the memory cell transistors M30, M31, M32, and M33 via the interlayer insulating film 34.

In the nonvolatile semiconductor memory device according to the modification of the third embodiment of the invention, the word lines CG10, CG11, CG12, CG13, CG20, CG21, CG22, CG23, ..., CG40, CG41, CG42, and CG43 which are connected to the control gate electrodes 23 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the metal electrode layer 27 in the vertical direction.

On the bit line BL side, in the contact portion for connecting the bit line BL and the drain region 12 of the memory cell transistor M13 which is closest to the bit line BL, the DB cathode region 19 of an n-type silicon layer is formed on the bit line BL, the DB anode region 18 of a p-type silicon layer is then formed on the DB cathode region 19, and the contact plug 26 is finally formed on the DB anode region 18. The bit-line-side diode DB is thus formed.

As described above, the occupation area of the NAND cell unit can be reduced by forming the source-line-side diode DS and the bit-line-side diode DB in the source-line-side contact and the bit-line-side contact, respectively.

In the example of FIG. 18, amorphous silicon or polysilicon is used to form the source/drain regions 12 and the channel regions 25. The memory cell transistor has the SONOS structure. In case where amorphous silicon or polysilicon is used, nitriding may be performed to suppress generation dangling bonds. Therefore, an SNONONS structure may be employed. Although it is assumed in this modification that the SONOS/TFT is of an n-channel type, it may be of a p-channel type.

Figure 19:
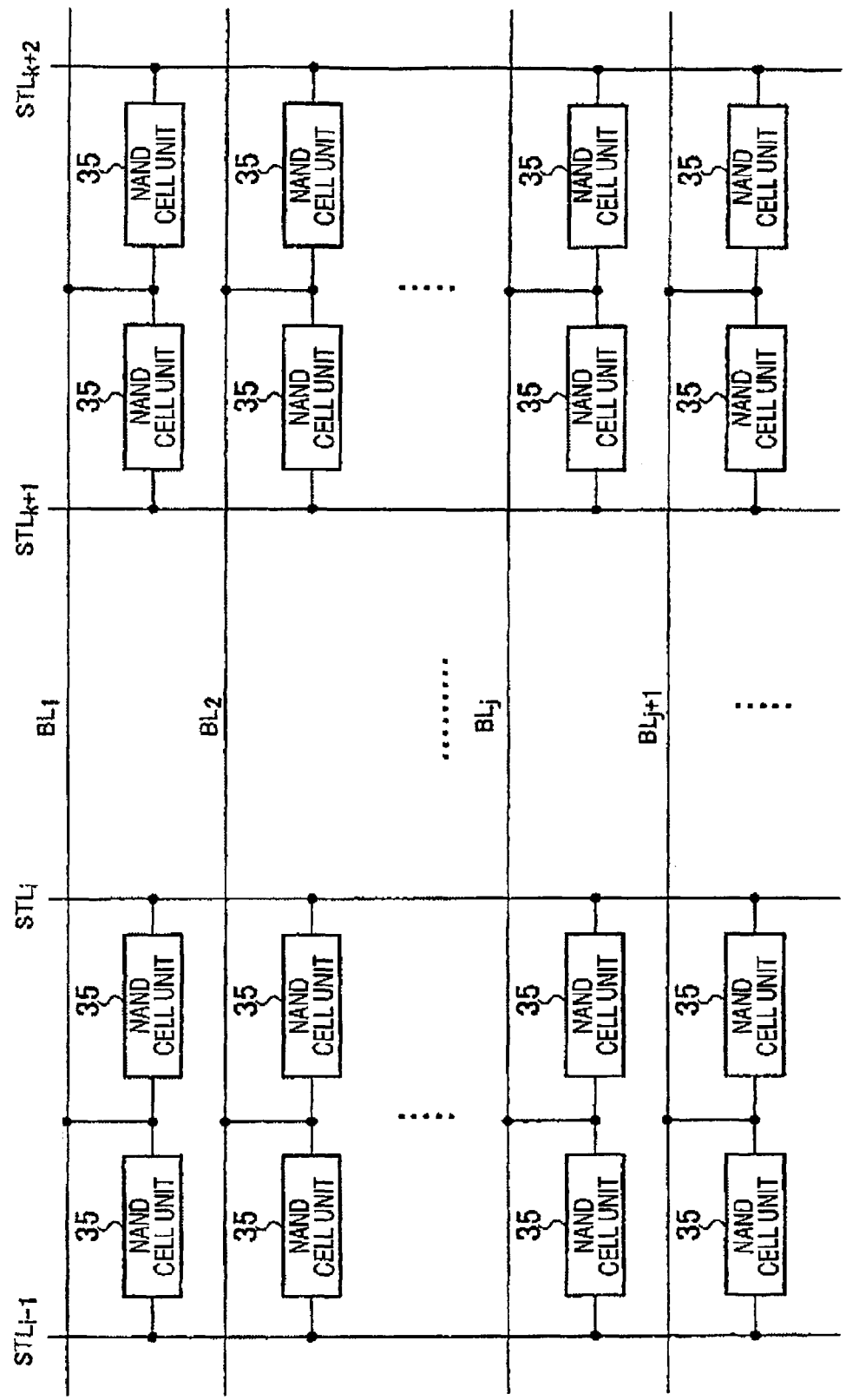
FIG. 19 shows a schematic circuit configuration of a NAND cell unit array of the nonvolatile semiconductor memory device according to the third embodiment in which diodes are employed as the select gates and the memory cell transistor has the SONOS/TFT structure.

FIG. 19 shows a schematic circuit configuration of an exemplary NAND cell unit array of the nonvolatile semiconductor memory device according to the third embodiment of the invention in which diodes are employed as the select gates and the memory cell transistor has the SONOS/TFT structure. The NAND cell unit array is provided with bit lines BL1, BL2, ..., BLj, BLj+1, ... which extend in the column direction and source lines ..., STLi−1, STLi, ..., STLk+1, STLk+2, ... which extend in the row direction. NAND cell units 35 are disposed at the crossing points of the bit lines BL1, BL2, ..., BLj, BLj+1, ... extending in the column direction and the source lines ..., STLi−1, STLi, ..., STLk+1, STLk+2, ... extending in the row direction. In the schematic circuit configuration of FIG. 19, adjoining NAND cell units 35 use a common bit-line-side diode DB as shown in FIG. 16.

The NAND nonvolatile semiconductor memory device according to the third embodiment of the invention makes it possible to miniaturize and simplify each memory cell unit by disposing diodes instead of select gate transistors and to increase the storage capacity by layering the memory cell transistors.

Fourth Embodiment

Figure 20:
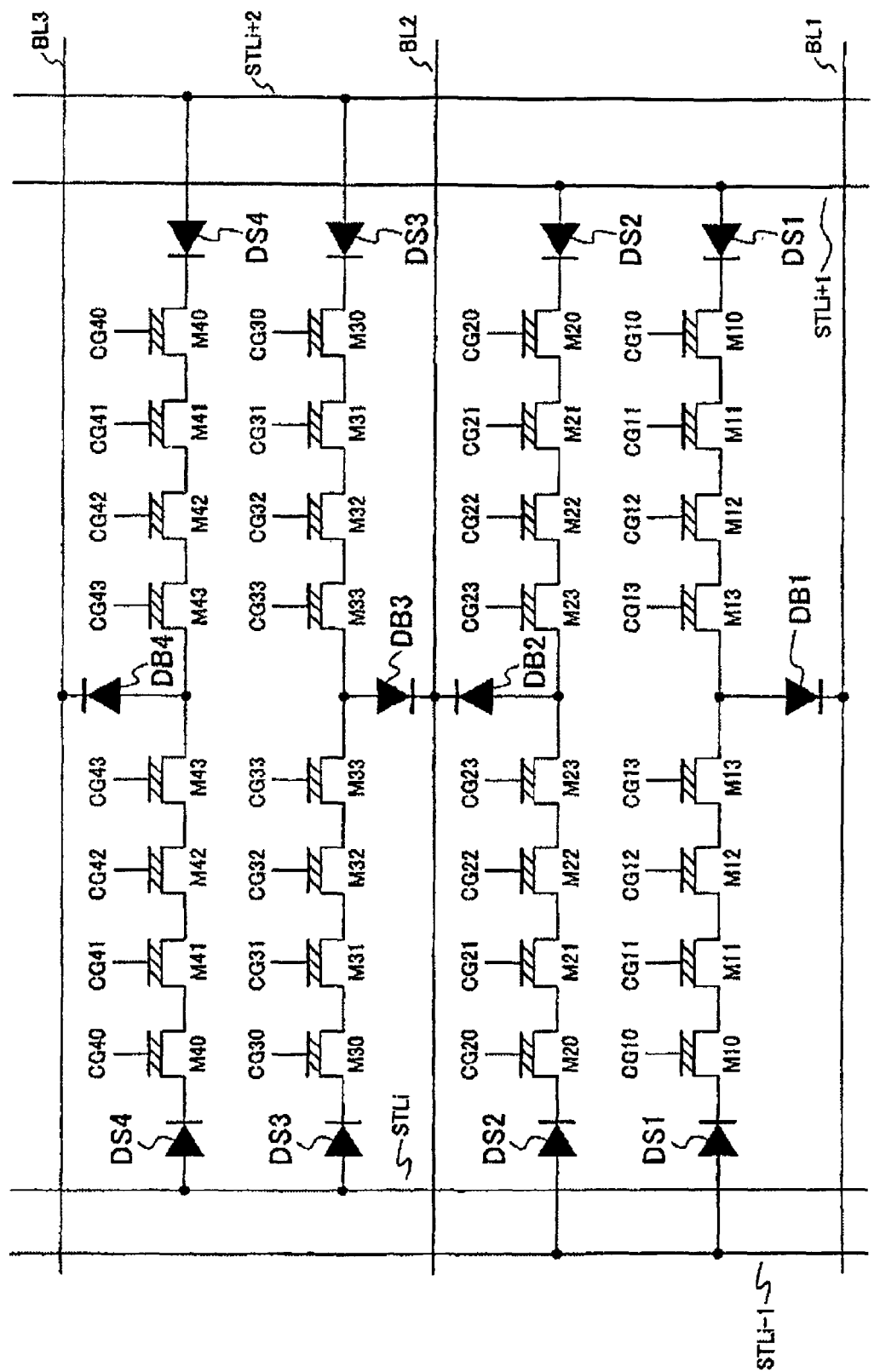
FIG. 20 shows a schematic circuit configuration of layered NAND cell units (four layers) of a nonvolatile semiconductor memory device according to a fourth embodiment of the invention in which diodes are employed as the select gates and the memory cell transistor has the SONOS/TFT structure.

FIG. 20 shows a schematic circuit configuration of layered NAND cell units (four layers) of a nonvolatile semiconductor memory device according to a fourth embodiment of the invention in which diodes are employed as the select gates and the memory cell transistor has the SONOS/TFT structure. In the nonvolatile semiconductor memory device according to the fourth embodiment of the invention, when NAND cell units are layered, a source line STL or a bit line BL is shared by vertically adjoining NAND cell units.

Figure 21:
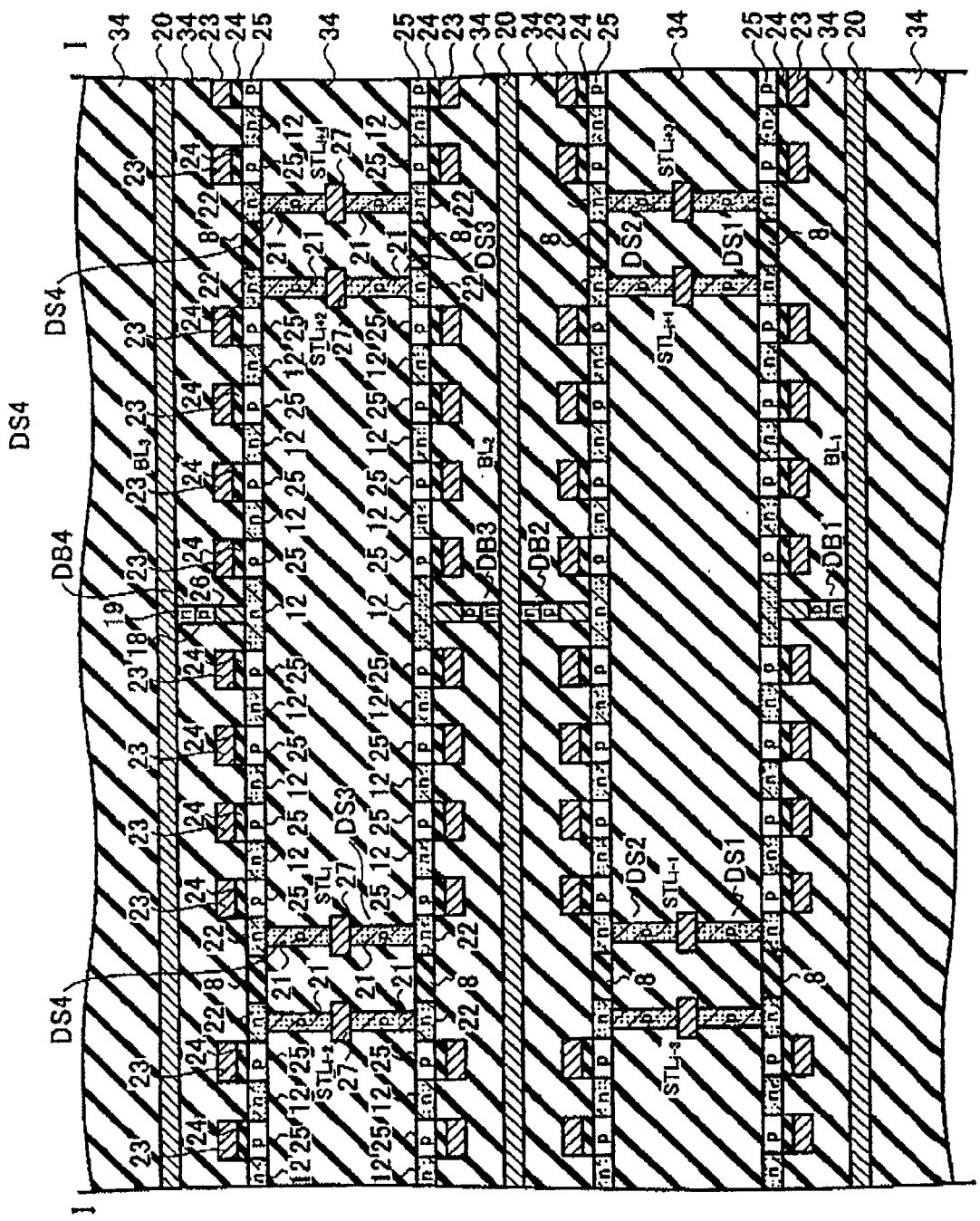
FIG. 21 shows a schematic sectional structure, taken along the bit line extending direction (line I-I), of the layered NAND cell units (four layers) of the nonvolatile semiconductor memory device according to the fourth embodiment of the invention in which diodes are employed as the select gates, the memory cell transistor has the SONOS/TFT structure, and a source line STL or a bit line BL is shared by vertically adjoining NAND cell units.

FIG. 21 shows a schematic sectional structure, taken along the bit line extending direction (line I-I), of the layered NAND cell units (four layers) of the nonvolatile semiconductor memory device according to the fourth embodiment of the invention in which diodes are employed as the select gates, the memory cell transistor has the SONOS/TFT structure, and a source line STL or a bit line BL is shared by vertically adjoining NAND cell units. In the nonvolatile semiconductor memory device according to the fourth embodiment of the invention, as shown in FIG. 21, the vertical positional relationship between the combination of the channel region 25 and the source/drain region 12 and the control gate electrode 23 is reversed every layer. However, this vertical positional relationship may be kept the same for all the layers.

As shown in FIG. 20 which shows the schematic circuit configuration of the layered NAND cell units (four layers) of the nonvolatile semiconductor memory device according to the fourth embodiment of the invention in which diodes are employed as the select gates and the memory cell transistor has the SONOS/TFT structure, the first layer is provided with a source-line-side diode DS1 having an anode region connected to a source line STLi−1, a bit-line-side diode DB1 having a cathode region connected to a bit line BL1, a memory cell string which is connected between the cathode region of the source-line-side diode DS1 and the anode region of the bit-line-side diode DB1 and in which plural memory cell transistors M10, M11, M12, and M13 having the SONOS/TFT structure are connected in series via their source/drain regions 12, a source-line-side diode DS1 having an anode region is connected to a source line STLi+1, and a memory cell string which is connected between the cathode region of the source-line-side diode DS1 and the anode region of the bit-line-side diode DB1 and in which plural memory cell transistors M10, M11, M12, and M13 having the SONOS/TFT structure are connected in series via their source/drain regions 12.

The second layer is provided with a source-line-side diode DS2 having an anode region connected to the source line STLi−1, a bit-line-side diode DB2 having a cathode region connected to a bit line BL2, a memory cell string which is connected between the cathode region of the source-line-side diode DS2 and the anode region of the bit-line-side diode DB2 and in which plural memory cell transistors M20, M21, M22, and M23 having the SONOS/TFT structure are connected in series via their source/drain regions 12, a source-line-side diode DS2 having an anode region connected to the source line STLi+1, and a memory cell string which is connected between the cathode region of the source-line-side diode DS2 and the anode region of the bit-line-side diode DB2 and in which plural memory cell transistors M20, M21, M22, and M23 having the SONOS/TFT structure are connected in series via their source/drain regions 12.

The third layer is provided with a source-line-side diode DS3 having an anode region connected to a source line STLi, a bit-line-side diode DB3 having a cathode region connected to the bit line BL2, a memory cell string which is connected between the cathode region of the source-line-side diode DS3 and the anode region of the bit-line-side diode DB3 and in which plural memory cell transistors M30, M31, M32, and M33 having the SONOS/TFT structure are connected in series via their source/drain regions 12, a source-line-side diode DS3 having an anode region is connected to a source line STLi+2, and a memory cell string which is connected between the cathode region of the source-line-side diode DS3 and the anode region of the bit-line-side diode DB3 and in which plural memory cell transistors M30, M31, M32, and M33 having the SONOS/TFT structure are connected in series via their source/drain regions 12.

The fourth layer is provided with a source-line-side diode DS4 having an anode region connected to the source line STLi, a bit-line-side diode DB4 having a cathode region connected to a bit line BL3, a memory cell string which is connected between the cathode region of the source-line-side diode DS4 and the anode region of the bit-line-side diode DB4 and in which plural memory cell transistors M40, M41, M42, and M43 having the SONOS/TFT structure are connected in series via their source/drain regions 12, a source-line-side diode DS4 having an anode region connected to the source line STLi+2, and a memory cell string which is connected between the cathode region of the source-line-side diode DS4 and the anode region of the bit-line-side diode DB4 and in which plural memory cell transistors M40, M41, M42, and M43 having the SONOS/TFT structure connected in series via their source/drain regions 12.

As shown in FIG. 21 showing the schematic sectional structure, taken along the bit line extending direction (line I-I), of the NAND cell units of the nonvolatile semiconductor memory device according to the fourth embodiment of the invention in which diodes are employed as the select gates and the memory cell transistor has the SONOS/TFT structure, the first layer is provided with an interlayer insulating film 34, field isolation regions 8 formed in the interlayer insulating film 34, a DS cathode region 22 of a source-line-side diode DS1 formed in the interlayer insulating film 34, a DS anode region 21 formed on the DS cathode region 22, a metal electrode layer 27 formed on the DS anode region 21 and connected to a source line STLi−1 which extends in the row direction, a drain region 12 formed in the interlayer insulating film 34, a contact plug 26 formed underneath the drain region 12, a DB anode region 18 formed underneath the contact plug 26, a DB cathode region 19 formed underneath the DB anode region 18, a bit line BL1 connected to the DB cathode region 19 and extending in the column direction, and a memory cell string which is connected between the DS cathode region 22 of the source-line-side diode DS1 and the drain region 12 that is connected to the DB anode region 18 and in which plural memory cell transistors M10, M11, M12, and M13 having the SONOS/TFT structure are connected in series via their source/drain regions 12. The above regions etc. are disposed between the field isolation regions 8. Furthermore, the first layer uses a common bit-line-side diode DB1 and the two memory cell strings each including the memory cell transistors M10, M11, M12, and M13 which are arranged in the column direction (bit line BL1 extending direction) are arranged symmetrically with respect to the bit-line-side diode DB1. As such, the two memory cell strings are connected to the bit line BL1 via the common bit-line-side diode DB1 and disposed between the source lines STLi−1 and STLi+1.

The second layer is provided with an interlayer insulating film 34, field isolation regions 8 formed in the interlayer insulating film 34, a DS cathode region 22 of a source-line-side diode DS2 formed in the interlayer insulating film 34, a DS anode region 21 formed underneath the DS cathode region 22, a metal electrode layer 27 formed underneath the DS anode region 21 and connected to the source line STLi−1 which is common to the first layer and extends in the row direction, a drain region 12 formed in the interlayer insulating film 34, a contact plug 26 formed on the drain region 12, a DB anode region 18 formed on the contact plug 26, a DB cathode region 19 formed on the DB anode region 18, a bit line BL2 connected to the DB cathode region 19 and extending in the column direction, and a memory cell string which is connected the DS cathode region 22 of the source-line-side diode DS2 and the drain region 12 that is connected to the DR anode region 18 and in which plural memory cell transistors M20, M21, M22, and M23 having the SONOS/TFT structure are connected in series via their source/drain regions 12. The above regions etc. are disposed between the field isolation regions 8. Furthermore, the second layer uses a common bit-line-side diode DB2 and the two memory cell strings each including the memory cell transistors M20, M21, M22, and M23 which are arranged in the column direction (bit line BL2 extending direction) are arranged symmetrically with respect to the bit-line-side diode DB2. As such, the two memory cell strings are connected to the bit line BL2 via the common bit-line-side diode DB2 and disposed between the source lines STLi−1 and STLi+1.

The third layer is provided with an interlayer insulating film 34, field isolation regions 8 formed in the interlayer insulating film 34, a DS cathode region 22 of a source-line-side diode DS3 formed in the interlayer insulating film 34, a DS anode region 21 formed on the DS cathode region 22, a metal electrode layer 27 formed on the DS anode region 21 and connected to a source line STLi which extends in the row direction, a drain region 12 formed in the interlayer insulating film 34, a contact plug 26 formed underneath the drain region 12, a DB anode region 18 formed underneath the contact plug 26, a DB cathode region 19 formed underneath the DB anode region 18, the bit line BL2 common to the second layer is connected to the DB cathode region 19 and extends in the column direction, and a memory cell string which is connected between the DS cathode region 22 of the source-line-side diode DS3 and the drain region 12 that is connected to the DB anode region 18 and in which plural memory cell transistors M30, M31, M32, and M33 having the SONOS/TFT structure are connected in series via their source/drain regions 12. The above regions etc are disposed between the field isolation regions 8. Furthermore, the third layer uses a common bit-line-side diode DB3 and the two memory cell strings each including the memory cell transistors M30, M31, M32, and M33 which are arranged in the column direction (bit line BL2 extending direction) are arranged symmetrically with respect to the bit-line-side diode DB3. As such, the two memory cell strings are connected to the bit line BL2 via the common bit-line-side diode DB2 and disposed between the source lines STLi and STLi+2.

The fourth layer is provided with an interlayer insulating film 34, field isolation regions 8 formed in the interlayer insulating film 34, a DS cathode region 22 of a source-line-side diode DS4 formed in the interlayer insulating film 34, a DS anode region 21 formed underneath the DS cathode region 22, a metal electrode layer 27 formed underneath the DS anode region 21 and connected to the source line STLi which extends in the row direction, a drain region 12 formed in the interlayer insulating film 34, a contact plug 26 formed on the drain region 12, a DB anode region 18 formed on the contact plug 26, a DB cathode region 19 formed on the DB anode region 18, a bit line BL3 connected to the DB cathode region 19 and extending in the column direction, and a memory cell string which is connected between the DS cathode region 22 of the source-line-side diode DS4 and the drain region 12 that is connected to the DB anode region 18 and in which plural memory cell transistors M40, M41, M42, and M43 having the SONOS/TFT structure are connected in series via their source/drain regions 12. The above regions etc. are disposed between the field isolation regions 8. Furthermore, the fourth layer uses a common bit-line-side diode DB4 and the two memory cell strings each including the memory cell transistors M40, M41, M42, and M43 which are arranged in the column direction (bit line BL3 extending direction) are arranged symmetrically with respect to the bit-line-side diode DB4. As such, the two memory cell strings are connected to the bit line BL3 via the common bit-line-side diode DB4 and disposed between the source lines STLi and STLi+2.

As shown in FIG. 21, the NAND cell units each including the source line STL, the source-line-side diode DS, the memory cell transistors (M10, M11, M12, and M13), the bit-line-side diode DB, and the bit line BL are layered in the vertical direction via the interlayer insulating films 34.

That is, the plural memory cell transistors M20, M21, M22, and M23 are disposed above the plural memory cell transistors M10, M11, M12, and M13 via the interlayer insulating film 34, the plural memory cell transistors M30, M31, M32, and M33 are disposed above the memory cell transistors M20, M21, M22, and M23 via the interlayer insulating film 34, and the plural memory cell transistors M40, M41, M42, and M43 are disposed above the memory cell transistors M30, M31, M32, and M33 via the interlayer insulating film 34.

In the nonvolatile semiconductor memory device according to the fourth embodiment of the invention, the word lines CG10, CG11, CG12, CG13, CG20, CG21, CG22, CG23, ..., CG40, CG41, CG42, and CG43 which are connected to the control gate electrodes 23 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the metal electrode layer 27 in the vertical direction.

On the bit line BL side, in the contact portion for connecting the bit line BL and the drain region 12 of the memory cell transistor M13 which is closest to the bit line BL, the DB cathode region 19 of an n-type silicon layer is formed on the bit line BL, the DE anode region 18 of a p-type silicon layer is then formed on the DE cathode region 19, and the contact plug 26 is finally formed on the DE anode region 18. The bit-line-side diode DB is thus formed.

As described above, the occupation area of the NAND cell unit can be reduced by forming the source-line-side diode DS and the bit-line-side diode DB in the source-line-side contact and the bit-line-side contact, respectively.

In the example of FIG. 21, amorphous silicon or polysilicon is used to form the source/drain regions 12 and the channel regions 25. The memory cell transistor has the SONOS structure. In case where amorphous silicon or polysilicon is used, nitriding may be performed to suppress generation dangling bonds. Therefore, an SNONONS structure may be employed. Although it is assumed in this embodiment that the SONOS/TFT is of an n-channel type, it may be of a p-channel type.

FIG. 22 shows schematic planar patterns for description of wiring at end portions of a memory cell array of layered NAND cell units (four layers) of the nonvolatile semiconductor memory device according to the fourth embodiment of the invention in which diodes are employed as the select gates and the memory cell transistor has the SONOS/TFT structure.

Figures 22A, 22B, 22C, 22D:
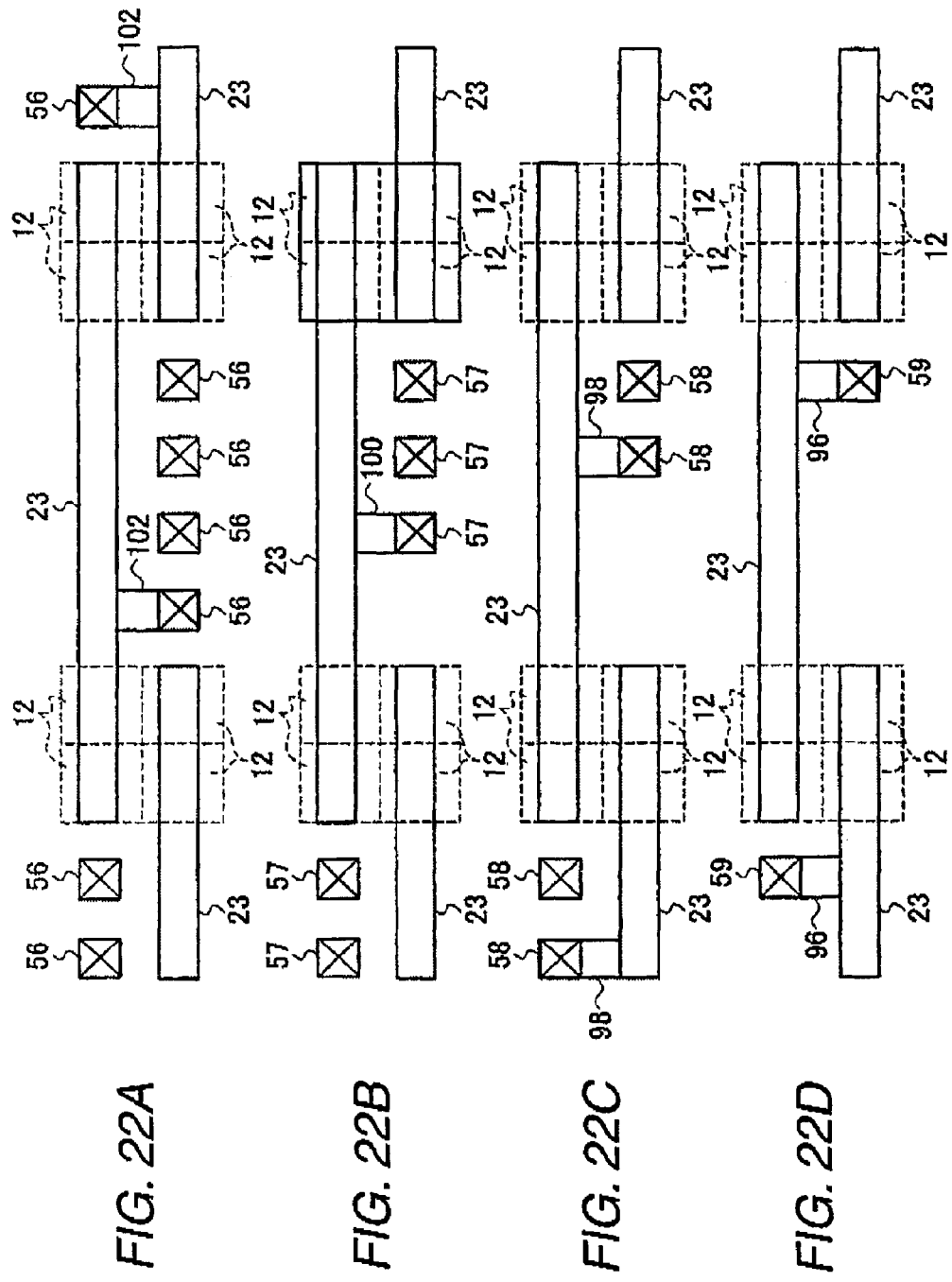

FIG. 22A shows an exemplary arrangement of contact plugs 56 which connect the first layer of the memory cell array to a CMOS layer. The control gate electrodes 23 formed above the source/drain regions 12 of the memory cell array extend in the row direction toward a peripheral portion of the memory cell array, where they are connected to contact plugs 56 via metal electrode layers 102 as shown in FIG. 22A.

FIG. 22B shows an exemplary arrangement of contact plugs 57 which connect the second layer of the memory cell array to its first layer. The control gate electrodes 23 formed above the source/drain regions 12 of the memory cell array extend in the row direction toward a peripheral portion of the memory cell array, where they are connected to contact plugs 57 via metal electrode layers 100 as shown in FIG. 22B.

FIG. 22C shows an exemplary arrangement of contact plugs 58 which connect the third layer of the memory cell array to its second layer. The control gate electrodes 23 formed above the source/drain regions 12 of the memory cell array extend in the row direction toward a peripheral portion of the memory cell array, where they are connected to contact plugs 58 via metal electrode layers 98 as shown in FIG. 22C.

FIG. 22D shows an exemplary arrangement of contact plugs 59 which connect the fourth layer of the memory cell array to its third layer. The control gate electrodes 23 formed above the source/drain regions 12 of the memory cell array extend in the row direction toward a peripheral portion of the memory 15 cell array, where they are connected to contact plugs 59 via metal electrode layers 96 as shown in FIG. 22D.

In the nonvolatile semiconductor memory device according to the fourth embodiment of the invention, free areas are produced on the silicon substrate surface by virtue of the layering of the memory cell array. Part of the drivers for the source lines STL and the word lines CG, the sense amplifier S/A, etc. can be formed in these free areas. The chip size can be reduced by utilizing the free areas in this manner.

Figure 23:
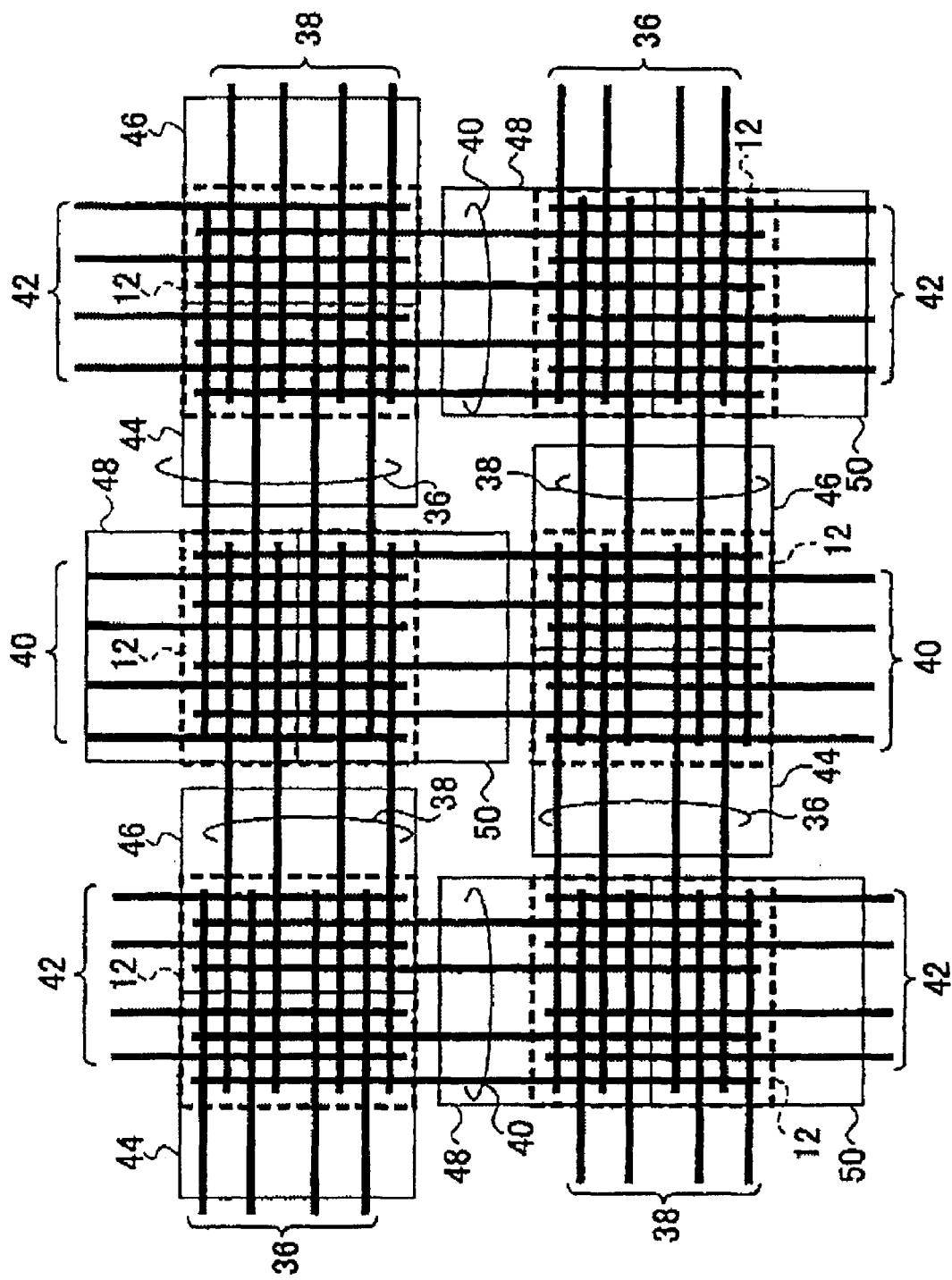
FIG. 23 shows an exemplary planar pattern for reducing the chip size by utilizing free areas produced on the semiconductor substrate surface by layering of a memory cell array in the nonvolatile semiconductor memory device according to the fourth embodiment of the invention.

In the nonvolatile semiconductor memory device according to the fourth embodiment of the invention, for example, as shown in FIG. 23, even-numbered source lines/word lines 36 and odd-numbered source lines/word lines 38 are arranged so as to extend in the row direction over source/drain areas 12 and even-numbered bit lines 40 and odd-numbered bit lines 42 are arranged so as to extend in the column direction over the source/drain areas 12. As shown in FIG. 23, even-numbered source line/word line decoder/driver areas 44 and odd-numbered source line/word line decoder/driver areas 46 are disposed in peripheral areas, in the row direction, of part of the source/drain areas 12. Furthermore, as shown in FIG. 23, even-numbered bit line decoder/sense amplifier areas 48 and odd-numbered bit line decoder/sense amplifier areas 50 are disposed in peripheral portions, in the column direction, of the source/drain areas 12, The concept of reducing the chip side by utilizing free areas on the semiconductor substrate surface as shown in FIG. 23 is not only available in the nonvolatile semiconductor memory device according to the fourth embodiment of the invention but likewise available also in the nonvolatile semiconductor memory devices according to the first to third embodiments of the invention.

The NAND nonvolatile semiconductor memory device according to the fourth embodiment of the invention makes it possible to miniaturize and simplify each memory cell unit by disposing diodes instead of select gate transistors and to increase the storage capacity by layering the memory cell transistors.

Furthermore, the NAND nonvolatile semiconductor memory device according to the fourth embodiment of the invention makes it possible to reduce the chip side by utilizing free areas on the semiconductor substrate surface.

Fifth Embodiment (Device Structure)

A nonvolatile semiconductor memory device according to a fifth embodiment of the invention has a back gate line BGL which extends in the row direction and is connected to a semiconductor region 29. The fifth embodiment can be combined with the third or fourth embodiment. To save the diode formation spaces and thereby increase the integration density, it is desirable that each of the source-line-side diode DS and the bit-line-side diode DB be formed in the direction perpendicular to the semiconductor region 29. A back gate electrode is connected to the semiconductor region 29 by means of a contact plug 30.

As for the nonvolatile semiconductor memory device according to the fifth embodiment of the invention, an exemplary layered structure in which the memory cell transistor is a TFT having the stack gate structure and the semiconductor region 29 is connected to the back gate line BGL extending in the row direction will be described. However, memory cell transistors can be layered in a similar manner also in the case where they are TFTs having the SONOS structure and a semiconductor region 29 is connected to a back gate line BGL extending in the row direction.

In the nonvolatile semiconductor memory device according to the fifth embodiment of the invention, the memory cell unit is simplified by employing diodes instead of select gate transistors.

Figure 24A:
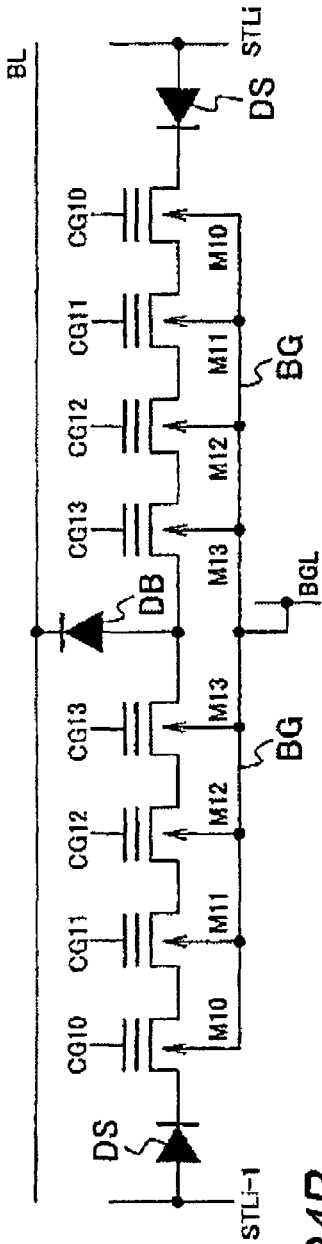
FIGS. 24A and 24B show a schematic circuit configuration and a schematic sectional structure, taken along the bit line extending direction (line I-I), of NAND cell units of a nonvolatile semiconductor memory device according to a fifth embodiment of the invention in which diodes are employed as the select gates and the memory cell transistor has the stack gate structure.
Figure 24B:
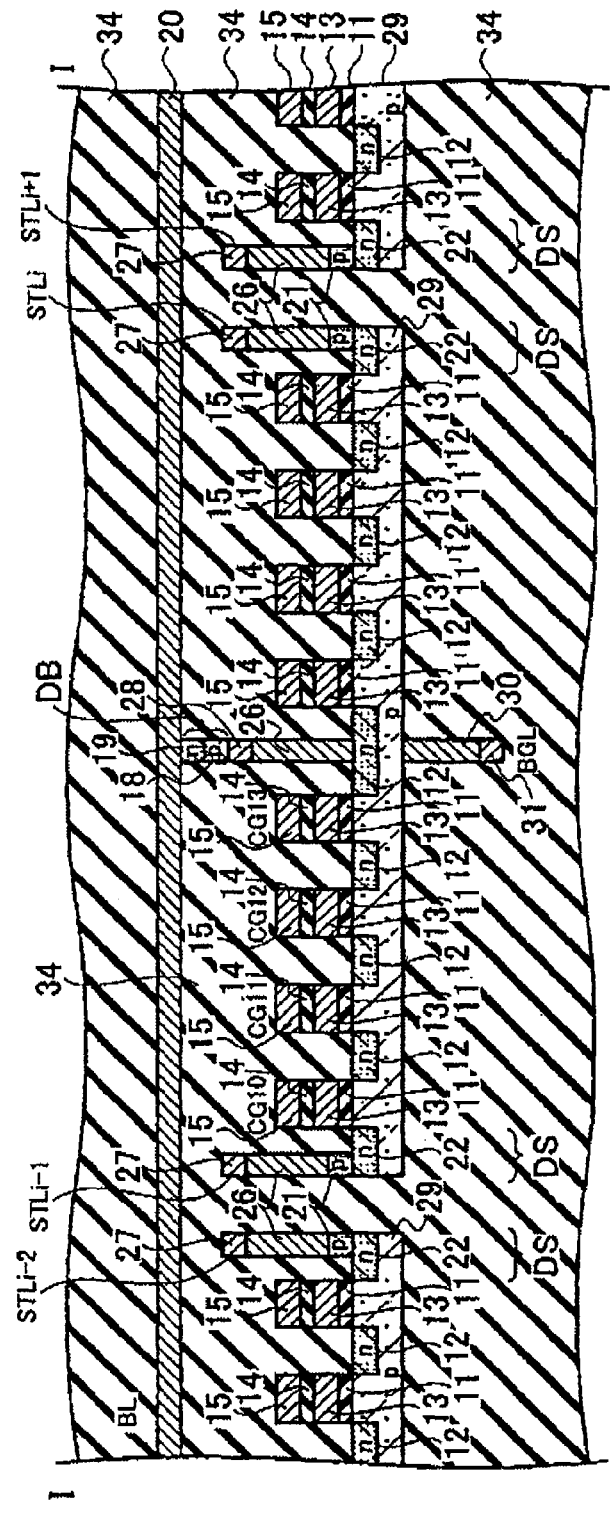

FIGS. 24A and 24B show a circuit configuration and a schematic sectional structure of 4-NAND-cell units in which diodes are employed as the select elements instead of MOS transistors, the memory cell transistor has the stack gate structure, and a semiconductor region 29 is connected to a back gate line BGL extending in the row direction. It is assumed that the memory cell transistor is an nMOS transistor. It is apparent that the memory cell transistor may also be a pMOS transistor (the conductive type is reversed). In this case, the potential relationships and the anode/cathode positions of each diode are reversed.

FIGS. 24A and 24B show, as an example, a first layer of the layers of memory cell transistors in the nonvolatile semiconductor memory device according to the fifth embodiment of the invention in which the semiconductor region 29 is connected to the back gate line BGL extending in the row direction. Although not shown in any drawings, the positional relationship between the source/drain regions 12 and the control gate electrode 15 may be changed.

FIG. 24A shows the schematic circuit configuration of the NAND cell units of the nonvolatile semiconductor memory device according to the fifth embodiment of the invention in which diodes are employed as the select gates, the memory cell transistor has the stack gate structure, and the semiconductor region 29 is connected to the back gate line BGL extending in the row direction. The NAND cell units are provided with a source-line-side diode DS having an anode region connected to a source line STLi–1, a bit-line-side diode DS having a cathode region connected to a bit line BL, a memory cell string which is connected between the cathode region of the source-line-side diode DS and the anode region of the bit-line-side diode DB and in which plural memory cell transistors M10, M11, M12, and M13 having the stack gate structure are connected in series via their source/drain regions 12, a source-line-side diode DS having anode region connected to a source line STLi, a memory cell string which is connected between the cathode region of the source-line-side diode DS and the anode region of the bit-line-side diode DB and in which plural memory cell transistors M10, M11, M12, and M13 having the stack gate structure are connected in series via their source/drain regions 12, and a back gate line BGL connected to a semiconductor region 29 of the memory cell transistors and extending in the row direction.

As shown in FIG. 24B, the memory cell transistor used in the nonvolatile semiconductor memory device according to the fifth embodiment of the invention has a stack gate structure including a semiconductor region 29, source/drain regions 12 formed in the semiconductor region 29, a channel region between the source/drain regions 12, a gate insulating film 11 formed on the channel region, a floating gate electrode 13 formed on the gate insulating film 11, an intergate insulating film 14 formed on the floating gate electrode 13, and a control gate electrode 15 formed on the intergate insulating film 14.

FIG. 24B shows the schematic sectional structure, taken along the bit line extending direction (line I-I), of the NAND cell units of the nonvolatile semiconductor memory device according to the fifth embodiment of the invention in which diodes are employed as the select gates, the memory cell transistor has the stack gate structure, and the semiconductor region 29 is connected to the back gate line BGL extending in the row direction. The WAND cell units are provided with a semiconductor region 29, field isolation regions 8 formed in the semiconductor region 28, a DS cathode region 22 of a source-line-side diode DS formed in the semiconductor region 29, a DS anode region 21 formed on the DS cathode region 22, a contact plug 26 formed on the DS anode region 21, a metal electrode layer 27 formed on the contact plug 26 and connected to a source line STLi–1 which extends in the row direction, a drain region 12 formed in the semiconductor region 29, a contact plug 26 formed on the drain region 12, a metal electrode layer 28 formed on the contact plug 26, a DB anode region 18 formed on the metal electrode layer 28, a DB cathode region 19 formed on the DB anode region 18, a bit line 20 connected to the DB cathode region 19 and extending in the column direction, and a memory cell string which is connected between the DS lo cathode region 22 of the source-line-side diode DS and the drain region 12 that is connected to the DB anode region 18 and in which plural memory cell transistors M10, M11, M12, and M13 having the stack gate structure are connected in series via their source/drain regions 12. The above regions etc. are disposed between the field isolation regions 8.

In the nonvolatile semiconductor memory device according to the fifth embodiment of the invention, as shown in FIGS. 24A and 24B, the bit-line-side diode DB is used in common for the adjacent two memory cell strings in the column direction. That is, as shown in FIGS. 24A and 245, the two memory cell strings each including the memory cell transistors M10, M11, M12, and M13 which are arranged in the column direction (i.e., bit line BL extending direction) are arranged symmetrically with respect to the bit-line-side diode DB. As such, the two memory cell strings are connected to the bit line BL via the common bit-line-side diode DB and disposed between the source lines STLi–1 and STLi.

NAND cell units each including the source line STL, the source-line-side diode DS, the memory cell transistors (M10, M11, M12, and M13), the bit-line-side diode DB, and the bit line BL as shown in FIGS. 24A and 24B may be layered via interlayer insulating films 34 in the direction perpendicular to the semiconductor region 29.

That is, plural memory cell transistors M20, M21, M22, and M23 are disposed above the plural memory cell transistors M10, M11, M12, and M13 via an interlayer insulating film 34, plural memory cell transistors M30, M31, M32, and M33 are disposed above the memory cell transistors M20, M21, M22, and M23 via an interlayer insulating film 34, and plural memory cell transistors M40, M41, M42, and M43 are disposed above the memory cell transistors M30, M31, M32, and M33 via an interlayer insulating film 34.

In the nonvolatile semiconductor memory device according to the fifth embodiment of the invention, word lines CG10, CG11, CG12, CG13, CG20, CG21, CG22, CG23, . . . , CG40, CG41, CG42, and CG43 which are connected to the control gate electrodes 15 of the respective memory cell transistors extend in the row direction which is perpendicular to the bit lines BL.

To form the source-line-side diode DS adjacent to the source line STL that is connected to the metal electrode layer 27 and an n-type silicon layer of the source region of the memory cell transistor M10 that is closest to the source line STL, the DS anode region 21 of a p-type silicon layer is buried in the contact. That is, the source region of the memory cell transistor M10 which is closest to the source line STL is formed as the DS cathode region 22 and the DS anode region 21 is buried between the DS cathode region 22 and the contact plug 26 in the vertical direction.

On the bit line BL side, after an ohmic contact to the drain region 12 of the memory cell transistor M13 which is closest to the bit line BL is formed by the contact plug 26, the metal electrode layer 28 is formed on the contact plug 26 and the DB anode region 18 of a p-type silicon layer and 15 the DB cathode region 19 of an n-type silicon layer are buried sequentially on the metal electrode layer 28. The bit-line-side diode DB is thus formed.

As described above, the occupation area of the NAND cell unit can be reduced by forming the source-line-side diode DS and the bit-line-side diode DB in the source-line-side contact and the bit-line-side contact, respectively.

The source-line-side diode DS which is located on the side of the source line STL may have a Schottky junction instead of a pn junction. Likewise, the bit-line-side diode DB which is located on the side of the bit line BL need not always be a pn-junction diode. Since the current direction at read may be one direction, the select element can be a diode instead of a MOS transistors Since the diode is a two-terminal element, selection is made according to the voltage magnitude relationship between the source line STL and the bit line BL.

(Example of Operation Voltage)

FIG. 25 shows an example of operation voltage of NAND cell units of the nonvolatile semiconductor memory device according to the fifth embodiment of the invention in which the memory cell transistors have the stack gate structure and the channel regions are formed in the semiconductor region 29 which is connected to the back gate line BGL extending in the row direction.

For a selected memory cell string, FIG. 25 shows pulse voltage states of the back gate line BGL, the bit line BL, the source line STL, a selected word line CG, and an unselected word line CG in respective operation modes of a read mode, a "0"-write mode, a "1"-write mode, and an erase mode. Likewise, for an unselected memory cell string, FIG. 25 shows pulse voltage states of the back gate line BGL, the bit line BL, the source line STL, and the word lines CG in respective operation modes of a read mode, a "0"-write mode, a "1"-write mode, and an erase mode. In FIG. 25, symbol VDD represents a power supply potential, VSS represents a ground potential, VRR represents a read voltage, VPP represents a write voltage, VEE represents an erase voltage, and VMM represents a bootstrap voltage. The voltage VRR is set higher than Vth('0') (a threshold voltage in a "0"-written state).

Figure 26:
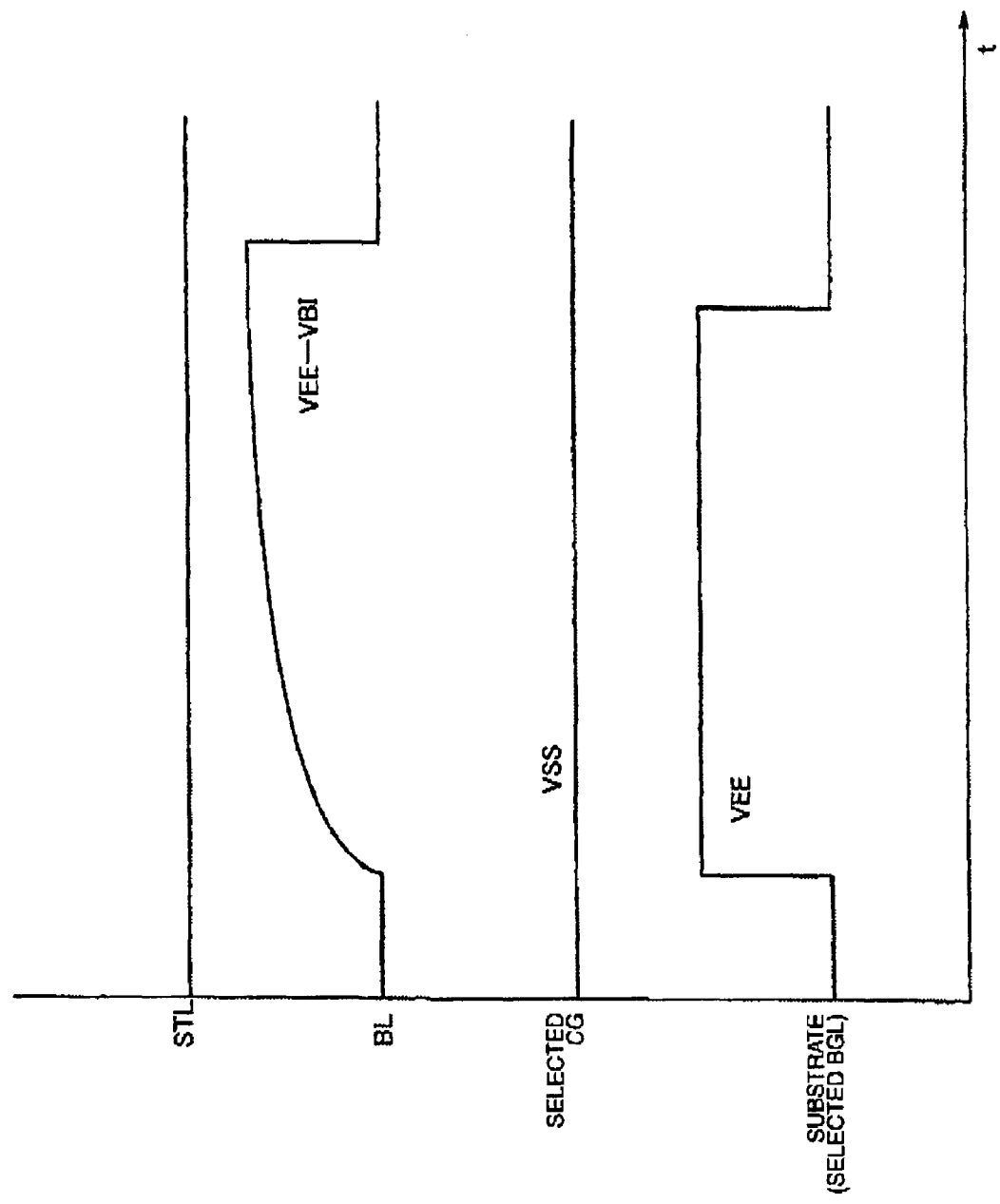
FIG. 26 shows operation waveforms in an erase operation, which conform to the operation voltage shown in FIG. 25, of the nonvolatile semiconductor memory device according to the fifth embodiment of the invention.

FIG. 26 shows operation waveforms in an erase operation which conform to the voltage shown in FIG. 25. In the erase operation, the memory cell transistors in a selected memory cell string are rendered in an erased state together. In FIG. 26, symbol VBI represents a built-in potential of a pn junction. FIG. 26 shows pulse voltage applied to the source line STL, a selected word line CG, the bit line BL, and the back gate line BGL. As shown in FIG. 26, the potential of the bit line BL is given by VEE-VBI.

Figure 27:
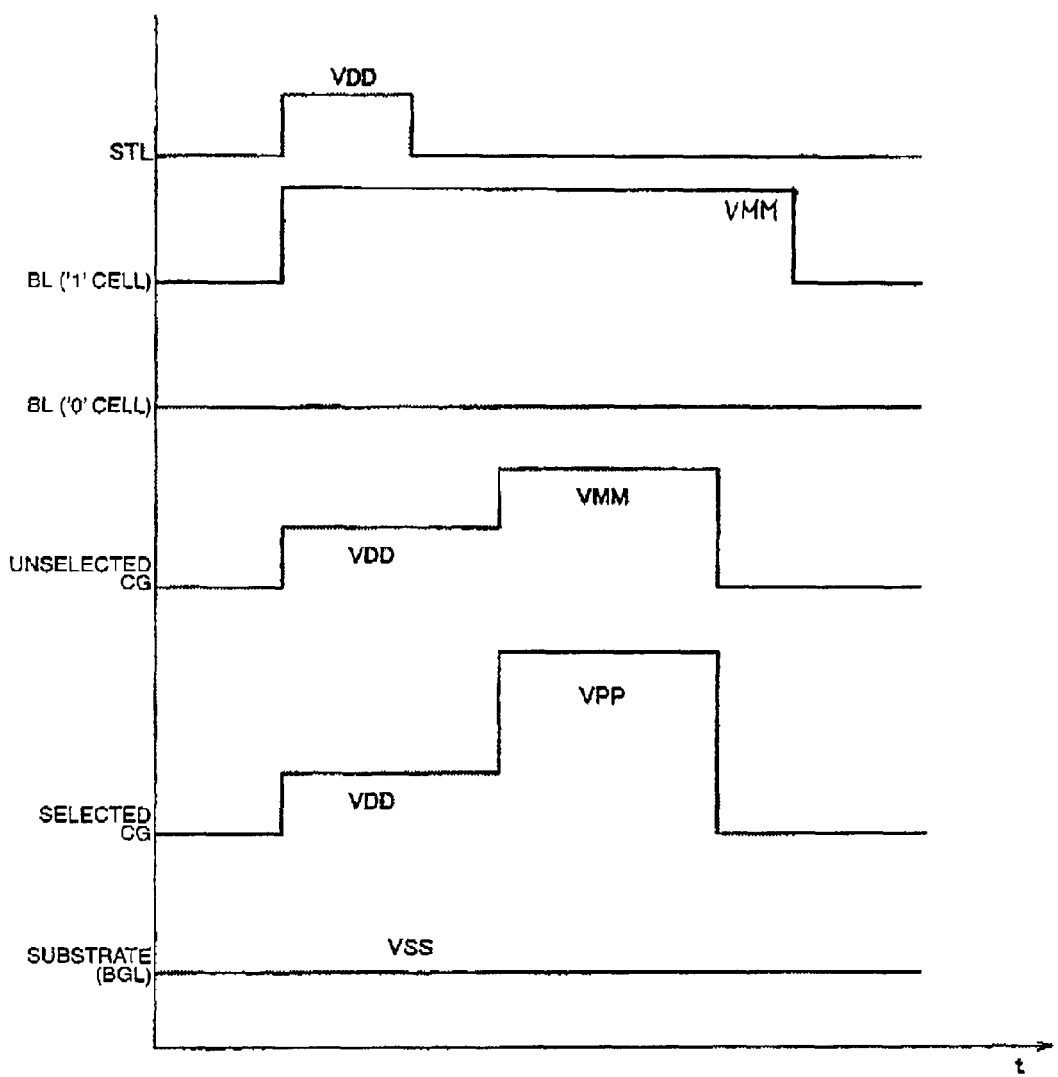
FIG. 27 shows operation waveforms in a write operation, which conform to the operation voltage shown in FIG. 25, of the nonvolatile semiconductor memory device according to the fifth embodiment of the invention.

FIG. 27 shows operation waveforms in a write operation which conform to the voltage shown in FIG. 25. FIG. 27 shows pulse voltage applied to the source line STL, the bit line BL of a "1"-write cell, the bit line BL of a "0"-write cell, an unselected word line CG, a selected word line CG, and the back gate line BGL.

Figure 28:
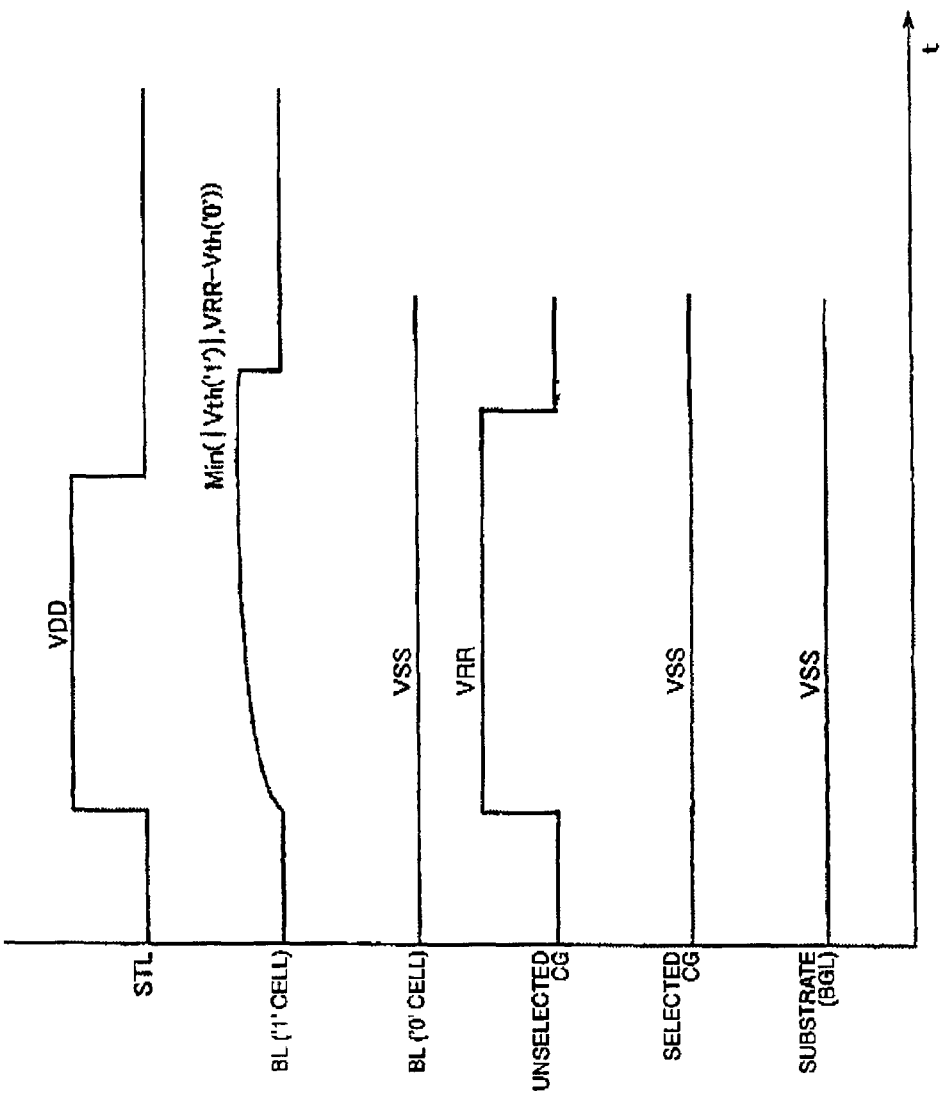
FIG. 28 shows operation waveforms in a read operation, which conform to the operation voltage shown in FIG. 25, of the nonvolatile semiconductor memory device according to the fifth embodiment of the invention.

FIG. 28 shows operation waveforms in a read operation which conform to the voltage shown in FIG. 25. FIG. 28 shows pulse voltage applied to the source line STL, the bit line BL of a "1"-written cell, the bit line BL of a "0"-written cell, an unselected word line CG, a selected word line CG, and the back gate line BGL.

A read operation is performed as charging from the source line STL to the bit line BL. The potential of the bit line BL remains the ground potential VSS or changes to a high level "H" in accordance with the threshold value of a selected memory cell transistor. Such a voltage is judged by the sense amplifier S/A.

A write verify operation and an erase verify operation are basically the same as the read operation except for differences in potential relationships (for example, the potential of a selected word line CG is higher than 0 V in the case of the write verify operation and the potentials of all the word lines CG in a selected memory cell string is 0 V in the case of the erase verify operation)

Write operation is performed in the following manner. To attain "1" write (an erased state is maintained) by self-boosting, the regions under the channels of a NAND cell unit is charged from the source line STL. Then, in the case of "0" write, the voltage of the bit line BL is set at 0 V (discharging) and the channel potential is set at VBI (a built-in voltage of the BL-side diode, about 0.6 V in the case of a silicon pn diode). In the case of "1" write, the bit line BL is given the power supply voltage VDD (high potential) for a pre-charged state is held, a selected word line CG is given the write voltage VPP and the voltage of an unselected word line CG in a selected NAND string is increased to the bootstrap voltage VMM, whereby the channel potential is thus bootstrapped to a potential at which write is not caused.

The bootstrap voltage VMM is set at such a potential that "0" is not written to an unselected memory cell transistor in a selected NAND string when the channel potential is low, and that the channel potential of a "1"-written memory cell transistor is increased sufficiently and an erased state is thereby held. The precharge voltage for the source line STL may be set at the power supply voltage VDD. However, where the power supply voltage VDD is about 1.8 V, it is desirable that the precharge voltage for the source line STL be set at the bootstrap voltage VMM.

No problem arises as long as the voltage of the bit line BL at the time of "1" write is such as to prevent a fall of a bootstrap potential. However, setting the voltage of the bit line BL at the time of "1" write comparable to the precharge voltage for the source line STL is advantageous in a sense that it dispenses with formation of an extra power circuit.

In an erase operation, the erase voltage VEE is applied to the back gate line BGL, a selected word line CG is given the ground potential VSS, and the source line STL is rendered in a floating state. The erase operation will be described below in detail.

First, an erase operation is performed by applying a high potential to the source region of the memory cell transistor M10 which is closest to the source line STL, from the source line STL via the source-line-side diode DS. Then, the potential of the word line CG of the memory cell transistor M10 which is closest to the source line STL is increased to VXX, whereby the high potential is transferred to the drain region of the memory cell transistor M10. That is, the high potential is applied to the source region of the next memory cell transistor M11 to effect erasure. Then, the potential of the word line CG of the memory cell transistor M11 is increased to VXX, whereby the high potential is transferred to the drain region of the memory cell transistor M11. That is, the high potential is applied to the source region of the next memory cell transistor M12 to effect erasure. The above operation is performed repeatedly, whereby the data of the memory cell transistors M10, M11, M12, and M13 of the selected memory cell string are erased.

The voltage VXX is a voltage that allows transfer of a high potential (VEE-VBI) where VBI is the built-in voltage of the source-line-side diode DS. The voltage VEE is a voltage that allows a low potential to cause development of a sufficiently strong electric field in the semiconductor region 29 through capacitive coupling between the control gate electrode and the floating gate electrode.

In the NAND nonvolatile semiconductor memory device according to the fifth embodiment of the invention, since it is provided with the back gate structure which is connected to the back gate line BGL extending in the row direction, in an erase operation, the memory cell transistors in a selected block can be rendered in an erased state together. Furthermore, the storage capacity can be increased by combining the fifth embodiment with any of the first to fourth embodiments, that is, by miniaturizing and simplifying each memory cell unit by using diodes instead of select gate transistors and layering memory cell transistors.

Sixth Embodiment

Figure 29:
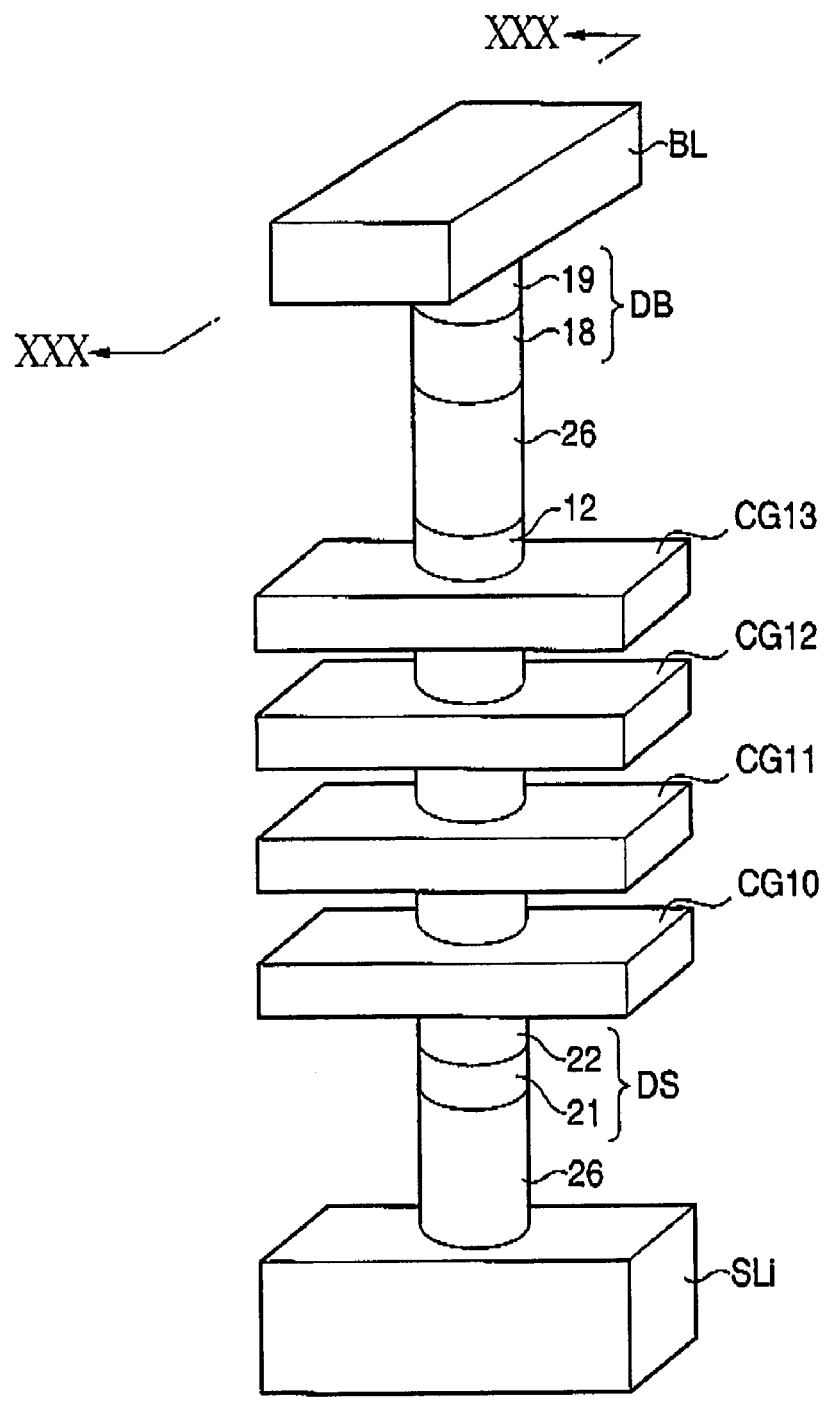
FIG. 29 shows a schematic perspective view of a NAND cell units of a nonvolatile semiconductor memory device according to a sixth embodiment of the invention.

FIG. 29 shows a schematic perspective view of NAND cell units of a nonvolatile semiconductor memory device according to a sixth embodiment of the invention. A NAND cell unit has the surrounding gate transistor (SGT) structure. An example of the SGT structure is disclosed by Tetsuo Endoh et al. (see "Novel Ultrahigh-Density Flash Memory With a Stacked-Surrounding Gate Transistor (S-SGT) Structured Cell," IEEE Transactions on Electron Devices, Vol. 50, No. 4, pp. 945-951, April 2003). According to the nonvolatile semiconductor memory device of the sixth embodiment, diodes are used as select gates instead of select gate transistors.

As shown in FIGS. 29, the NAND cell unit of this embodiment is connected to a bit line EL extending in a column direction, a source line STLi extending in a row direction perpendicular to the column direction, and word lines CG10, CG11, CG12, CG13 extending in the row direction. The NAND cell unit includes a source-line-side diode DS having an anode region connected to a source line STLi, a bit-line-side diode DB having a cathode region connected to a bit line BL, a memory cell string which is connected between the cathode region of the source-line-side diode DS and the anode region of the bit-line-side diode DB and in which plural memory cell transistors M10, M11, M12, and M13 having the SONOS structure are connected in series via their source/drain regions 12. The source-line-side diode DS, the memory cell string and the lo bit-line-side diode DB are stacked in this order in a vertical direction. A circuit configuration of the NAND cell unit of this embodiment is similar to that shown in FIG. 1A.

Figure 30:
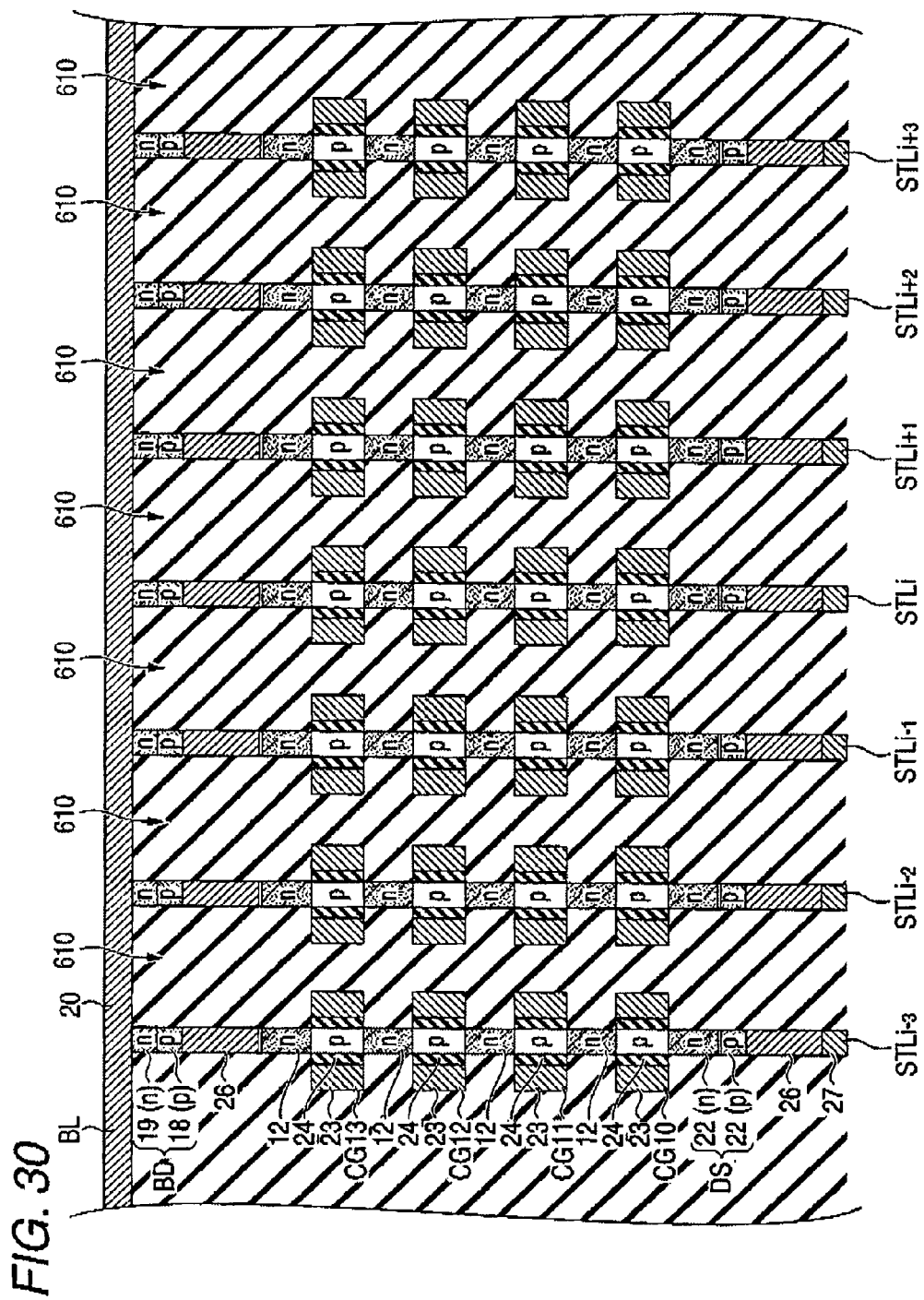
FIG. 30 shows a schematic sectional structure, taken along the bit line extending direction (line XXX-XXX), of NAND cell units of the nonvolatile semiconductor memory device according to the sixth embodiment of the invention.

FIG. 30 shows the schematic sectional structure, taken along the bit line extending direction (line XXX-XXX) shown in FIG. 29, of the NAND cell units of the nonvolatile semiconductor memory device according to the sixth embodiment of the invention. As shown in FIG. 30, the NAND cell units are isolated with each other via an insulating film 610. The NAND cell unit of this embodiment includes a semiconductor pillar (pillar shaped semiconductor) extending in the vertical direction perpendicular to a surface of a semiconductor substrate, a metal electrode layer 27 connected to a source line STLi that extends in the row direction, a first contact plug 26 formed on the metal electrode layer 27, a DS anode region 21 formed on the first contact plug 26, a DS cathode region 22 of a source-line-side diode DS formed on the DS anode region 21, a drain region 12 formed in the semiconductor pillar and vertically spaced from each other, a second contact plug 26 formed on the drain region 12, a DB anode region 18 formed on the second contact plug 26, a DB cathode region 19 formed on the DS anode region 18, a bit line 20 connected to the DB cathode region 19 and extending in the column direction, and a memory cell string connected between the DS cathode region 22 of the source-line-side diode DS and the drain region 12 that is electrically connected to the DB anode region 18 of the bit-line-side diode DB. The memory cell string includes plural memory cell transistors M10, M11, M12, and M13 having the SONOS gate structures which are vertically connected in series via their source/drain regions 12.

Each of the memory cell transistor M10 to M13 includes the source/drain regions 12, a channel region between the source/drain regions 12, an ONO insulating film 24 formed to surround the channel region, and a control gate electrode 23 formed to surround the ONO insulating film 24.

Although the above explained memory cell transistors M10 to M13 has SONOS structures, the memory cell transistors M10 to M13 may have a stack gate structure. In this case, the gate insulating film, a floating gate electrode, an intergate insulating film and a control gate electrode are sequentially formed to surround the channel region. Also, the memory cell transistors M10 to M13 may have other gate structures such as MONOS structure, a MANOS structure, etc.

The NAND nonvolatile semiconductor memory device according to the sixth embodiment of the invention makes it possible to miniaturize and simplify each memory cell unit by disposing diodes instead of select gate transistors and to increase the storage capacity by layering the memory cell transistors.

Furthermore, the NAND nonvolatile semiconductor memory device according to the sixth embodiment of the invention makes it possible to reduce the chip side by stacking the memory cell transistors in the vertical direction.

Other Embodiments

Although the invention has been described above by using the first to sixth embodiments, it should not be construed that the invention is limited to the descriptions and drawings as parts of this disclosure. Based on this disclosure, a person skilled in the art would find various alternative embodiments and implementation techniques.

Furthermore, the memory cell transistor of each of the nonvolatile semiconductor memory devices according to the first to sixth embodiments is not limited to a memory of binary logic and can be a memory of multivalued logic of three values or more. For example, a 4-value-storage nonvolatile semiconductor memory device can attain a two times higher storage capacity than a binary storage nonvolatile semiconductor memory device does. That is, the invention can also be applied to a nonvolatile semiconductor memory device of multi-value storage (multi-value m≧3).

Still further, the structure of the memory cell transistor of each of the nonvolatile semiconductor memory devices according to the first to fifth embodiments is not limited to the layered structure, the SONOS structure, or the MONOS structure and may be the side wall control gate structure or the SOL structure.

As exemplified above, it goes without saying that the invention covers various embodiments etc. that are not described in this specification. Therefore, the technical scope of the invention should be determined solely by the invention-defining items, properly stated on the basis of the above description, of the claims.

What is claimed is:

1. A nonvolatile semiconductor memory device comprising:
   a source-line-side diode having an anode region that is connected to a source line;
   a bit-line-side diode having a cathode region that is connected to a bit line; and
   a memory cell string connected between a cathode region of the source-line-side diode and an anode region of the bit-line-side diode, the memory cell string including a series connection of a plurality of memory cell transistors containing a first stage transistor connected to the source-line-side diode and a last stage transistor connected to the bit-line-side diode,
   wherein the source-line-side diode is formed in a contact for connecting the source line and the memory cell string in a first direction perpendicular to a semiconductor substrate, and the bit-line-side diode is formed in a contact for connecting the bit line and the memory cell string in the first direction.

2. The device according to claim 1, wherein each of the memory cell transistors comprises a gate insulating film formed above the semiconductor substrate, a charge storage layer formed on the gate insulating film, and a control gate electrode formed on the charge storage layer.

3. The device according to claim 1, wherein the memory cell string is formed on a semiconductor substrate, and the memory cell transistors are connected in a second direction parallel to the semiconductor substrate.

4. The device according to claim 1,
   wherein the cathode region of the source-line-side diode is shared with a source region of the first stage transistor.

5. The device according to claim 4, wherein the cathode region of the source-line-side diode, the anode region of the source-line side diode, and the source line are arranged in the first direction in this order.

6. The device according to claim 1,
   wherein the anode region of the bit-line-side diode is electrically connected to a drain region of the last stage transistor, and
   wherein the cathode region of the bit-line-side diode, the anode region of the bit-line-side diode, and the bit line are arranged in the first direction in this order.

7. The device according to claim 1,
   wherein the memory cell string is formed on an insulating layer, and
   wherein the plurality of memory cell transistors include source/drain regions which are formed in a semiconductor layer formed on the insulating layer and contact with the insulating layer.

8. The device according to claim 7,
   wherein when an erase operation is performed, predetermined potential is applied to the source line and then transferred in order from the source region of the first stage transistor to the source region of the last stage transistor.

9. The device according to claim 8, wherein the erase operation includes:
   setting the source line at the predetermined potential, setting gate electrodes of the plurality of memory cell transistors at ground potential, and setting the bit line at a floating state; and
   starting to apply a second potential sequentially from the first stage transistor to a previous stage of the last stage transistor,
   wherein the second potential allows the memory cell transistor to transfer potential applied to a source region to a drain region.

10. The device according to claim 1, wherein the source-line-side diode and the bit-line-side diode are extended from the memory cell string in opposite directions with each other along the first direction.

11. The device according to claim 1, wherein the plurality of memory cell transistors include a semiconductor region connected to a back gate line extending in a row direction perpendicular to the bit line.

12. The device according to claim 1,
   wherein the source-line-side diode, the memory cell string and the bit-line-side diode are stacked in the first direction, and
   wherein the plurality of memory cell transistors in the memory cell string are connected in the first direction.

13. The device according to claim 12,
   wherein the memory cell transistor comprises: source/drain regions formed in a pillar-shaped semiconductor region extending in the first direction and spaced from each other in the first direction; a channel region between the source/drain regions; a gate insulating film formed to surround the channel region; a charge storage layer formed to surround the gate insulating film; and a control gate electrode formed to surround the charge storage layer.

14. A nonvolatile semiconductor memory device comprising:
   a first source-line-side diode having an anode region connected to a source line;
   a first bit-line-side diode having a cathode region connected to a first bit line;
   a first memory cell string connected between a cathode region of the first source-line-side diode and an anode region of the first bit-line-side diode, the first memory cell string including a series connection of a plurality of memory cell transistors;

a second source-line-side diode having an anode region connected to the source line;

a second bit-line-side diode having a cathode region connected to a second bit line; and a second memory cell string connected between a cathode region of the second source-line-side diode and an anode region of the second bit-line-side diode, the second memory cell string including a series connection of a plurality of memory cell transistors, wherein the first memory cell string and the second memory cell string are layered above a semiconductor substrate via an interlayer insulating film, wherein each of the first and second source-line-side diodes is formed in a contact for connecting the source line and the first or second memory cell string in a first direction perpendicular to the semiconductor substrate, wherein the first bit-line-side diode is formed in a contact for connecting the first bit line and the first memory cell string in the first direction, and wherein the second bit-line-side diode is formed in a contact for connecting the second bit line and the second memory cell string in the first direction.

15. The device according to claim 14, wherein each of the memory cell transistors comprises a gate insulating film formed above the semiconductor substrate, a charge storage layer formed on the gate insulating film, and a control gate electrode formed on the charge storage layer.

16. The device according to claim 14, wherein the plurality of memory cell transistors include a semiconductor region connected to a back gate line extending in a row direction perpendicular to the first and second bit lines.

17. A nonvolatile semiconductor memory device comprising:

a first source-line-side diode having an anode region connected to a first source line;

a bit-line-side diode having a cathode region connected to a bit line;

a first memory cell string connected between a cathode region of the first source-line-side diode and an anode region of the bit-line-side diode, the first memory cell string including a series connection of a plurality of memory cell transistors;

a second source-line-side diode having an anode region connected to a second source line; and a second memory cell string connected between a cathode region of the second source-line-side diode and the anode region of the bit-line-side diode, the second memory cell string including a series connection of a plurality of memory cell transistors, wherein the first memory cell string and the second memory cell string are formed in a same layer above a semiconductor substrate via an interlayer insulating film, wherein the first source-line-side diode is formed in a contact for connecting the first source line and the first memory cell string in a first direction perpendicular to the semiconductor substrate, wherein the second source-line-side diode is formed in a contact for connecting the second source line and the second memory cell string in the first direction, and wherein the bit-line-side diode is formed in a contact for connecting the bit line and the first and second memory cell strings in the first direction.

18. The device according to claim 17, wherein each of the memory cell transistors comprises a gate insulating film formed above the semiconductor substrate, a charge storage layer formed on the gate insulating film, and a control gate electrode formed on the charge storage layer.

19. The device according to claim 17, wherein the memory cell transistors include a semiconductor region connected to a back gate line extending in a row direction perpendicular to the bit line.

* * * * *